United States Patent [19]
Kishi

[11] Patent Number: 6,087,230
[45] Date of Patent: Jul. 11, 2000

[54] METHOD OF FABRICATING AN SOI DEVICE HAVING A CHANNEL WITH VARIABLE THICKNESS

[75] Inventor: Toshiyuki Kishi, Tokorozawa, Japan

[73] Assignee: Citizen Watch Co., Ltd., Tokyo, Japan

[21] Appl. No.: 09/168,384

[22] Filed: Oct. 8, 1998

Related U.S. Application Data

[62] Division of application No. 08/886,415, Jul. 1, 1997, Pat. No. 5,973,358.

[51] Int. Cl.$^7$ .................................................. H01L 21/336
[52] U.S. Cl. ......................... 438/287; 438/311; 257/324; 257/347
[58] Field of Search ..................................... 257/324, 347; 438/287, 311

[56] References Cited

U.S. PATENT DOCUMENTS

| | | | |
|---|---|---|---|
| 4,247,860 | 1/1981 | Tihanyi | 257/404 |
| 5,309,007 | 5/1994 | Kelner et al. | 257/286 |
| 5,648,671 | 7/1997 | Merchant | 257/347 |
| 5,684,318 | 11/1997 | Ayres et al. | 257/334 |
| 5,969,387 | 10/1999 | Letavic et al. | 257/347 |
| 6,023,090 | 2/2000 | Letavic et al. | 257/347 |

FOREIGN PATENT DOCUMENTS 8-172199  7/1996  Japan.

*Primary Examiner*—Richard Elms
*Assistant Examiner*—Christian D. Wilson
*Attorney, Agent, or Firm*—Armstrong, Westerman, Hattori, McLeland & Naughton

[57] ABSTRACT

A semiconductor device is provided by forming an insulating film on a supporting substrate and a semiconductor layer on the insulating film, forming an MOS semiconductor component having a source, a drain and a gate on the semiconductor layer, forming at least one of the source region of the semiconductor layer provided with the source and the drain region thereof provided with the drain to have greater thickness than a channel region of the semiconductor layer provided with a gate oxide film and a gate on the gate oxide film, and forming at least one of the source and the drain to be separated from the insulating film by the semiconductor layer of opposite conductivity type therefrom. A bulk layer of the same conductivity type as the semiconductor layer is provided in a thick region of the semiconductor layer. An MNOS or MONOS semiconductor nonvolatile memory cell can be formed by replacing the gate oxide film with a memory gate insulating film consisting of a silicon oxide film and a silicon nitride film.

10 Claims, 20 Drawing Sheets

METHOD OF FABRICATING AN SOI DEVICE HAVING A CHANNEL WITH VARIABLE THICKNESS

This application is a division of prior application Ser. No. 08/886,415 filed Jul. 1, 1997, now U.S. Pat. No. 5,973,358.

BACKGROUND OF THE INVENTION

1. Field of the Invention

This invention relates to a semiconductor device formed with an MOS semiconductor component or an MNOS or MONOS semiconductor non-volatile memory cell or the like formed on a semiconductor substrate including a supporting substrate, an insulating film (BOX: Buried Oxide) on the supporting substrate and a semiconductor layer on the insulating film, and to a method of fabricating the semiconductor device.

2. Description of the Related Art

Among known types of semiconductor devices are those that use a silicon-on-insulator (SOI) substrate, i.e., a substrate formed of a supporting substrate, an insulating film on the supporting substrate and a semiconductor layer on the insulating film.

Since the semiconductor device using an SOI substrate can achieve total insulation and isolation between the component parts, it can suppress latch-up (malfunction between adjacent transistors) and radiation-induced soft errors.

Moreover, if the semiconductor layer formed on the insulating film in such a semiconductor device is reduced to a thin film, the depletion layer charge comes to be governed mainly by the gate potential. This provides such effects as suppression of the short-channel effect and improvement in the current drive performance.

An example of a prior-art semiconductor device using an SOI substrate will be explained with reference to the sectional view of FIG. 38.

The SOI substrate consists of a supporting substrate 1, an insulating film 2 and a semiconductor layer 3. The periphery and undersurface of the semiconductor layer 3 are completely insulated and isolated by a field oxide film 31 and the insulating film 2.

An MOS semiconductor component is constituted by forming a gate oxide film 14 on a channel region 7 of the semiconductor layer 3, a gate (electrode) 8 on the gate oxide film 14, and a source 6 and a drain 5 consisting of high-concentration impurity layers at the regions (source region and drain region) on opposite sides of the gate 8. The source 6 and the drain 5 are both in contact with the insulating film 2.

Reference numeral 32 designates an interlevel insulator film formed with contact holes 33 at which interconnecting electrodes 34, 35 are provided in connection with the source 6 and the drain 5. A interconnecting electrode is also provided in connection with the gate 8 at a different sectional position from that shown in FIG. 38.

The problematic parasitic capacitance that arises in a semiconductor device using a bulk silicon substrate and no insulating film 2, namely, the parasitic capacitance of the PN junction formed between the bulk silicon substrate and the high-concentration impurity layers of the source and drain, also arises in this semiconductor device using the SOI substrate consisting of the supporting substrate 1, the insulating film 2 and the semiconductor layer 3.

As shown in the configuration of FIG. 38, therefore, the semiconductor layer 3 is formed as a thin film of a thickness of 100 nm or less and the high-concentration impurity layers of the source 6 and the drain are formed to contact the insulating film 2, in order to limit the PN junction formed between the high-concentration impurity layers and the semiconductor layer 3 to the channel region 7 immediately under the gate 8 of the semiconductor layer 3.

The MOS semiconductor component of the semiconductor device shown in FIG. 38 thus has a thin semiconductor layer 3 that is no more than 100 nm thick. The impurity of the high-concentration impurity layers of the source 6 and the drain 5 consequently reach as far as the insulating film 2.

Since the channel region 7 of the semiconductor layer 3 is therefore completely surrounded by the source 6, the drain 5 and the field oxide film 31, the semiconductor layer 3 of the channel region 7 floats electrically.

When an MOS semiconductor component, e.g., an N-channel MOS semiconductor component, having this electrically floating configuration is driven, the holes created in the depletion layer near the drain 5 accumulate in the semiconductor layer 3 to raise the overall potential, amplify injection of electrons from the source 6 and alter the current characteristic.

The change in the current characteristic becomes more pronounced with increasing source voltage since the electric field near the drain region increases with increasing source voltage.

Circuit regions constituted of this semiconductor component which are subject to high drive voltages, e.g. input/output protection circuits, step-down circuits, step-up circuits and the like, are therefore degraded in reliability.

Since the high-concentration impurity layers of the source 6 and the drain 5 extend to the interface with the insulating film 2, moreover, leak current occurs owing to the interface state density present at the interface between the semiconductor layer 3 and the insulating film 2. This leak current becomes pronounced under exposure to radiation.

A semiconductor device formed with a semiconductor non-volatile memory cell and having a configuration like the MOS semiconductor component just explained will now be explained with reference to the sectional view of FIG. 39.

Portions in FIG. 39 corresponding to those in FIG. 38 are assigned the same reference symbols as those in FIG. 38 and are not explained again here.

In this semiconductor device, a memory gate insulating film consisting of a tunnel oxide film 11, a silicon nitride film 12 and a top oxide film 13 is formed on the channel region 7 of the semiconductor layer 3 and the gate 8 is formed on the memory gate insulating film, thereby configuring an MONOS semiconductor non-volatile memory cell. The high-concentration impurity layers of the source 6 and the drain 5 formed by self-alignment on opposite sides of the gate 8 contact the insulating film 2. In other respects the configuration is the same as that of the semiconductor device shown in FIG. 38.

In the semiconductor layer shown in FIG. 39, parasitic capacitance is also suppressed by forming the semiconductor layer 3 as a thin film of a thickness of 100 nm or less and forming the high-concentration impurity layers of the source 6 and the drain 5 to contact the insulating film 2, thereby limiting the PN junction formed between the high-concentration impurity layers and the semiconductor layer 3 to the channel region 7 immediately under the gate 8 of the semiconductor layer 3.

This MONOS non-volatile memory cell becomes an MNOS non-volatile memory cell if the memory gate insulating film is formed of only the tunnel oxide film 11 and the silicon nitride film 12 and the top oxide film 13 is omitted.

In this MONOS or MNOS non-volatile memory cell, as in the MOS semiconductor component shown in FIG. 38, the semiconductor layer 3 of the channel region 7 floats electrically.

When data are written to or erased from the MONOS or MNOS non-volatile memory cell, therefore, the electric potential at the channel region 7 is unstable. This may cause operational errors.

This invention was accomplished to overcome the problems explained in the foregoing. The specific object of the invention is to provide a semiconductor device and a method of fabricating the same which enable the circuit regions of an MOS semiconductor component where the source voltage is high to operate with improved reliability and ensure that the writing and erasure of data to or from an MONOS or MNOS non-volatile memory cell are effected reliably.

SUMMARY OF THE INVENTION

For achieving this object, the invention provides semiconductor devices as set out below and methods of fabricating the same.

In one aspect of the invention, an insulating film is provided on a supporting substrate, a semiconductor layer is provided on the insulating film, and an MOS semiconductor component having a source, a drain and a gate is formed on the semiconductor layer as follows.

At least one of the source region of the semiconductor layer provided with the source and the drain region thereof provided with the drain is formed to have greater thickness than a channel region of the semiconductor layer provided with a gate oxide film and a gate on the gate oxide film. The thickness of semiconductor layer gradually changes in at least one of a boundary region of the channel region with the source region and a boundary region thereof with the drain region.

A bulk layer of the same conductivity type as the semiconductor layer is formed in a thick region of the semiconductor layer.

At least one of the source and the drain is separated from the insulating film by the semiconductor layer of opposite conductivity type therefrom.

In another aspect of the invention, an insulating film is provided on a supporting substrate, a semiconductor layer is provided on the insulating film, and an MNOS or MONOS semiconductor non-volatile memory cell having a source, a drain and a gate is formed on the semiconductor layer as follows.

At least one of the source region of the semiconductor layer provided with the source and the drain region thereof provided with the drain is formed to have greater thickness than a channel region of the semiconductor layer provided with a memory gate insulating film including a silicon oxide film and a silicon nitride film, and with a gate on the memory gate insulating film. The thickness of semiconductor layer gradually changes in at least one of a boundary region of the channel region with the source region and a boundary region thereof with the drain region.

A bulk layer of the same conductivity type as the semiconductor layer is formed in a thick region of the semiconductor layer.

At least one of the source and the drain is separated from the insulating film by the semiconductor layer of opposite conductivity type therefrom.

In another aspect of the invention, an insulating film is provided on a supporting substrate, a semiconductor layer is provided on the insulating film, the semiconductor layer has a first region provided with a memory cell constituted by a semiconductor non-volatile memory cell, a second region provided with an internal circuit constituted by an MOS semiconductor component, and a third region provided with an input/output protection circuit for protecting the internal circuit, and the thickness of the semiconductor layer at the first region and the third region is greater than that of the semiconductor layer at the second region.

A method of fabricating a semiconductor device according to the invention is characterized in that a semiconductor substrate including a supporting substrate, an insulating film on the supporting substrate and a semiconductor layer on the insulating film is subjected to etching or the like of a portion of the semiconductor layer to reduce the thickness thereof and provide the semiconductor layer with a thickly formed region, a thinly formed region and a boundary region of gradually changing thickness between said two regions, and the gate, source, drain, bulk layer and the like of a semiconductor component are formed on these regions. The specific methods of fabricating the individual semiconductor devices will be explained with respect to the embodiments thereof.

The above and other objects, features and advantages of the invention will be apparent from the following detailed description which is to be read in conjunction with the accompanying drawings.

DETAILED DESCRIPTION OF THE PREFERRED EMBODIMENTS

Embodiments of the invention will now be explained with reference to the drawings.

Figure 1:
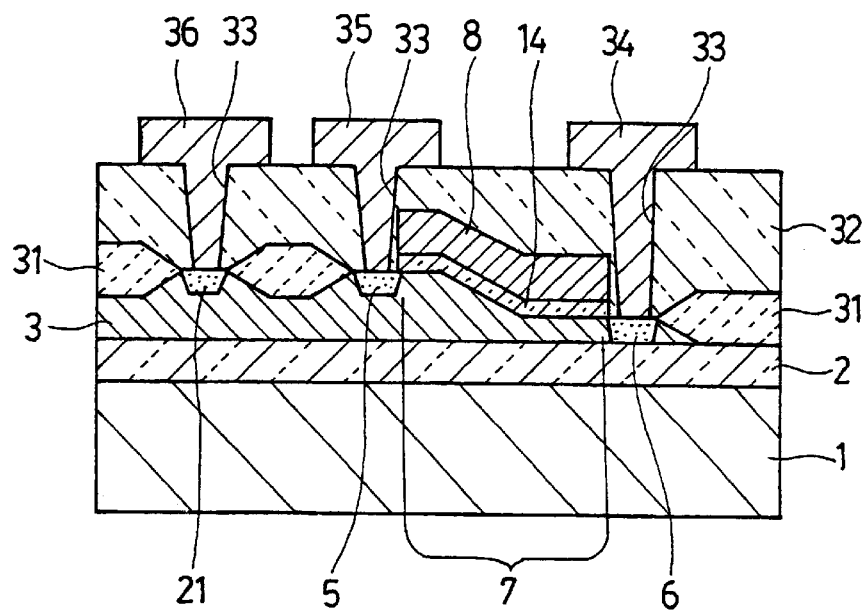
FIGS. 1 to 3 are schematic sectional views each showing the structure of a semiconductor device formed with an MOS semiconductor component, which is a different embodiment of the invention.
Figure 2:
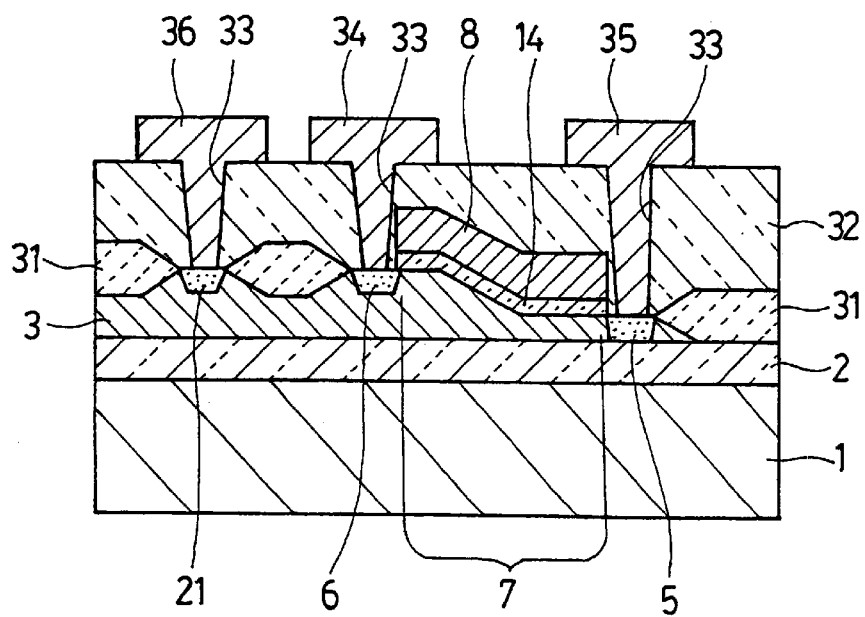
Figure 3:
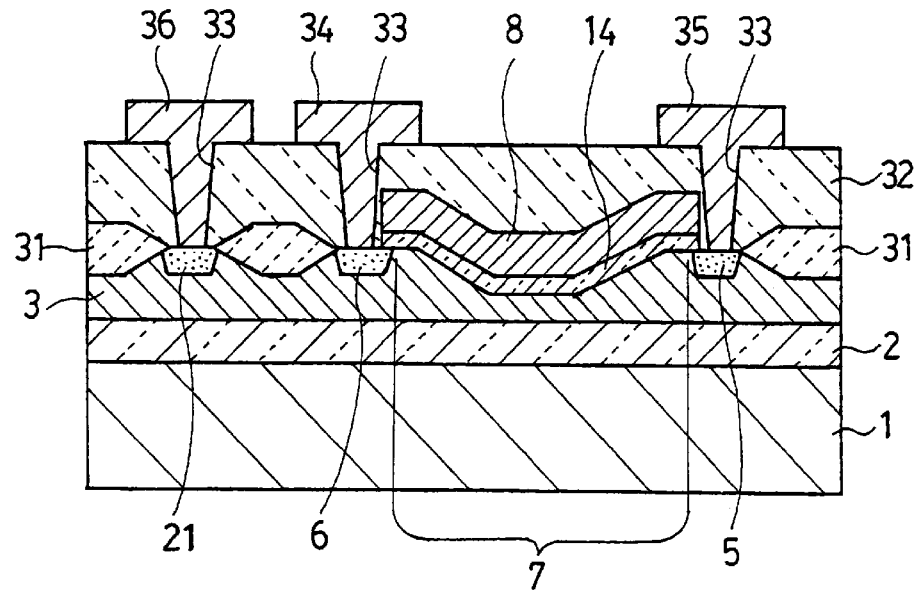

Embodiments of Semiconductor Devices Formed with MOS Semiconductor Components: FIGS. 1 to 3

A semiconductor device which is a first embodiment of the invention will now be explained with reference to the schematic sectional view of FIG. 1.

The semiconductor device shown in FIG. 1 uses an SOI substrate having a supporting substrate 1, an insulating film 2 and a semiconductor layer 3 to constitute an MOS semiconductor component.

A gate oxide film 14 is formed on a channel region 7 of the semiconductor layer 3, a gate (electrode) 8 is formed on the gate oxide film 14, and a source 6 and a drain 5 are formed as high-concentration impurity layers at a source region and a drain region self-aligned on opposite sides of the gate 8.

The semiconductor layer 3 of this semiconductor device is thicker at the drain region formed with the drain 5 than at the portion of the channel region 7 near the source region. The thickness of the semiconductor layer 3 gradually changes at the region within the channel region 7 constituting the boundary region thereof with the drain region. This is to improve the covering property of the gate oxide film 14 and the gate 8.

The semiconductor layer 3 of the MOS semiconductor component according to this invention is thus formed to have thin and thick regions.

The semiconductor layer 3 is opposite in conductivity type from the drain 5, the high-concentration impurity layer of the drain 5 is isolated from the insulating film 2 by the intervening semiconductor layer 3, and the high-concentration impurity layer of the source 6 is in contact with the insulating film 2.

The thickly formed region of the semiconductor layer 3 is provided with a bulk layer 21 formed so as not to contact the insulating film 2. The bulk layer 21 is a high-concentration impurity layer of the same conductivity type as the semiconductor layer 3.

Owing to the structure shown in FIG. 1, the channel region 7 in the semiconductor layer 3 of the semiconductor device conducts with the bulk layer 21.

The high-concentration impurity layers of the drain 5, the source 6 and the bulk layer 21 are insulated and isolated by field oxide films 31.

Interconnecting electrodes 34, 35 and 36 pass through contact holes 33 formed in an interlevel insulator film 32 to connect with the source 6, the drain 5 and the bulk layer 21. A interconnecting electrode is also provided in connection with the gate 8 at a different sectional position from that shown in FIG. 1.

The provision of the semiconductor layer 3 with the thickly formed region enables the bulk layer 21 to be provided in connection with the channel region 7 of the semiconductor layer 3 so as to avoid electrical floating of the semiconductor layer 3.

Since the charge occurring in the depletion layer near the drain 5 therefore flows to the bulk layer 21 and does not accumulate in and increase the potential of the semiconductor layer 3, an MOS semiconductor device exhibiting stable transistor operation can be obtained.

The second embodiment of the semiconductor device shown in FIG. 2 is another example of the invention semiconductor device formed with an MOS semiconductor component.

The structure of this semiconductor device is almost the same as the semiconductor device shown in FIG. 1 and differs therefrom only in that the positions of the source 6 and the drain 5 are reversed. The source region of the semiconductor layer 3 provided with the source 6 is therefore thicker than the channel region 7. The thickness of the semiconductor layer 3 gradually changes at the region within the channel region 7 constituting the boundary region thereof with the source region.

The semiconductor layer 3 is opposite in conductivity type from the source 6, the high-concentration impurity layer of the source 6 is isolated from the insulating film 2 by the intervening semiconductor layer 3, and the high-concentration impurity layer of the drain 5 is in contact with the insulating film 2. The channel region 7 in the semiconductor layer 3 of the semiconductor device therefore conducts with the bulk layer 21.

The third embodiment of the semiconductor device shown in FIG. 3 is another example of the invention semiconductor device formed with an MOS semiconductor component.

The semiconductor layer 3 of this semiconductor device is thinner at the middle portion of the channel region 7 than at the source region provided with the source 6 and the drain region provided with the drain 5.

The source region and the drain region of the semiconductor layer 3 are therefore thicker than the channel region 7 thereof. The thickness of the semiconductor layer 3 gradually changes at the regions within the channel region 7 constituting the boundary region thereof with the source region and the boundary region thereof with the drain region.

The semiconductor layer 3 is opposite in conductivity type from the source 6 and the drain 5, and the source 6 and the drain 5 are isolated from the insulating film 2 by the intervening semiconductor layer 3. The high-concentration impurity layer of the source 6 and the high-concentration impurity layer of the drain 5 therefore do not contact the insulating film 2. The channel region 7 in the semiconductor layer 3 therefore conducts with the bulk layer 21.

Like the semiconductor device shown in FIG. 1, the semiconductor devices shown in FIGS. 2 and 3 also exhibit stable transistor operation.

Figure 4:
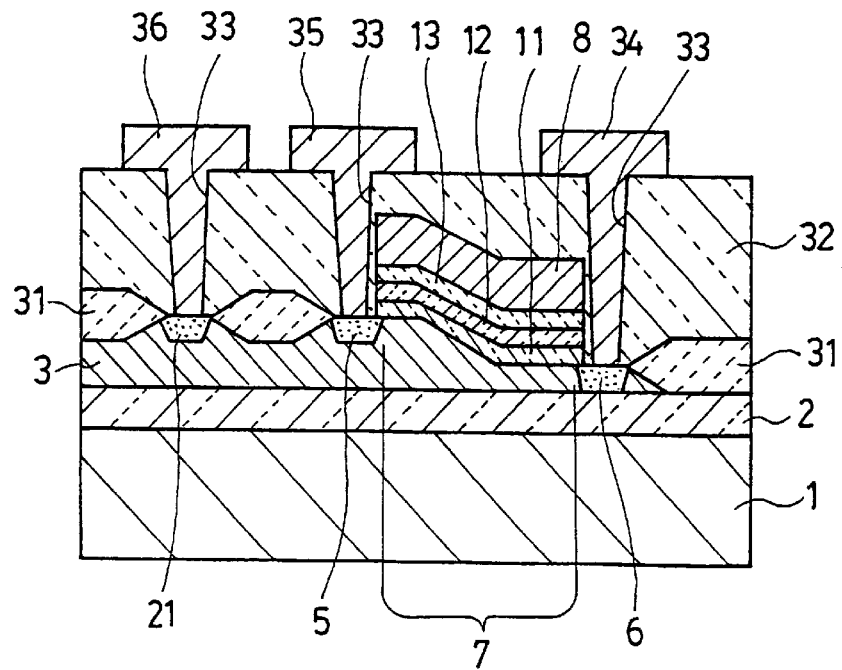
FIGS. 4 to 6 are schematic sectional views each showing the structure of a semiconductor device formed with an MONOS non-volatile memory cell, which is a different embodiment of the invention t
Figure 5:
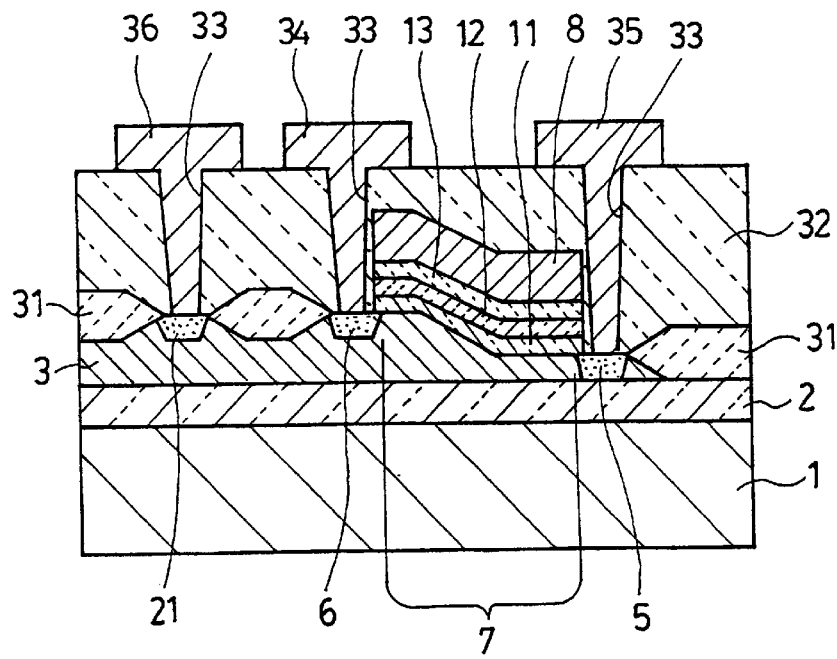
Figure 6:
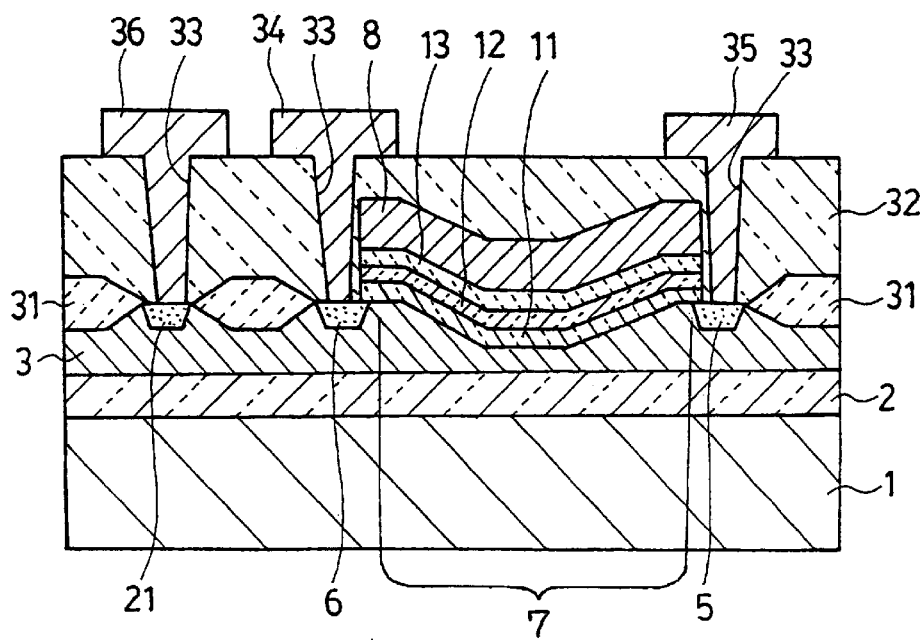

Embodiments of Semiconductor Devices Formed with MONOS Semiconductor Non-volatile Memory Cells: FIGS. 4 to 6

FIG. 4 is a schematic sectional view showing the structure of a semiconductor device which is a fourth embodiment of the invention. Portions in FIG. 4 corresponding to those in FIG. 1 are assigned the same reference symbols as those in FIG. 1 and are not explained again here.

This semiconductor device uses an SOI substrate comprising a supporting substrate, an insulating film on the supporting substrate and a semiconductor layer on the insulating film to constitute an MONOS semiconductor nonvolatile memory cell.

This semiconductor device differs from the semiconductor device shown in FIG. 1 only in that the channel region 7 in the semiconductor layer 3 of the SOI substrate is formed thereon with an ONO (silicon oxide-silicon nitride-silicon oxide) film consisting of a tunnel oxide film 11, a silicon nitride film 12 and a top oxide film 13, thereby constituting an MONOS semiconductor nonvolatile memory cell.

The tunnel oxide film 11, silicon nitride film 12 and top oxide film 13 constitute a memory gate insulating film.

Like the MOS semiconductor device explained with reference to FIG. 1, this MONOS semiconductor nonvolatile memory cell has the high-concentration impurity layer of its source 6 in contact with the insulating film 2 and the high-concentration impurity layer of its drain 5 out of contact with the insulating film 2.

The thickly formed region of the semiconductor layer 3 is formed with a high-concentration impurity layer constituting a bulk layer 21 that does not contact the insulating film 2. The channel region 7 in the semiconductor layer 3 of the semiconductor non-volatile memory cell therefore conducts with the bulk layer 21.

Owing to this provision of the bulk layer 21 in the thickly formed region of the semiconductor layer 3, the potential difference between the gate 8 and the channel region 7 during writing and erasure of data can be controlled by the voltage applied to the gate 8.

Specifically, since supply of carriers from the bulk layer 21 to the channel region 7 is effected by applying voltage to the gate 8, stable write and erase operations can be reliably effected.

FIG. 5 is a schematic sectional view showing the structure of a semiconductor device which is a fifth embodiment of the invention.

This semiconductor device is also formed with an MONOS semiconductor non-volatile memory cell. It differs from the fourth embodiment shown in FIG. 4 only in that the positions of the source 6 and the drain 5 are reversed.

The rest of the structure is the same as that of the second embodiment of FIG. 2 and the fourth embodiment of FIG. 4 and will not be explained again here.

FIG. 6 is a schematic sectional view showing the structure of a semiconductor device which is a sixth embodiment of the invention.

This semiconductor device is also formed with an MONOS semiconductor non-volatile memory cell. It differs from the fifth embodiment shown in FIG. 5 only in that the semiconductor layer 3 is thinner at the middle portion of the channel region 7 than at the source region provided with the source 6 and the drain region provided with the drain 5.

The source region and the drain region of the semiconductor layer 3 are therefore thicker than the channel region 7 thereof. The thickness of the semiconductor layer 3 gradually changes at the regions within the channel region 7 constituting the boundary region thereof with the source region and the boundary region thereof with the drain region.

The semiconductor layer 3 is opposite in conductivity type from the source 6 and the drain 5, and the source 6 and the drain 5 are isolated from the insulating film 2 by the intervening semiconductor layer 3. The high-concentration impurity layer of the source 6 and the high-concentration impurity layer of the drain 5 therefore do not contact the insulating film 2. The channel region 7 in the semiconductor layer 3 therefore conducts with the bulk layer 21.

The rest of the structure is the same as that of the third embodiment of FIG. 3 and the fifth embodiment of FIG. 5 and will not be explained again here.

Like the fourth embodiment explained with reference to FIG. 4, the semiconductor devices formed with MONOS semiconductor non-volatile memory cells shown in FIGS. 5 and 6 also enable data write and erase operations to be effected stably and reliably.

The semiconductor devices formed with MONOS semiconductor non-volatile memory cells shown in FIGS. 4 to 6 become MNOS semiconductor non-volatile memory cells if the memory gate insulating film formed between the semiconductor layer 3 and the gate 8 is formed of only the tunnel oxide film 11 and the silicon nitride film 12 and the top oxide film 13 is omitted.

Such an MNOS semiconductor non-volatile memory cell provides the same functions and effects as those obtained by the foregoing embodiments.

Figure 7:
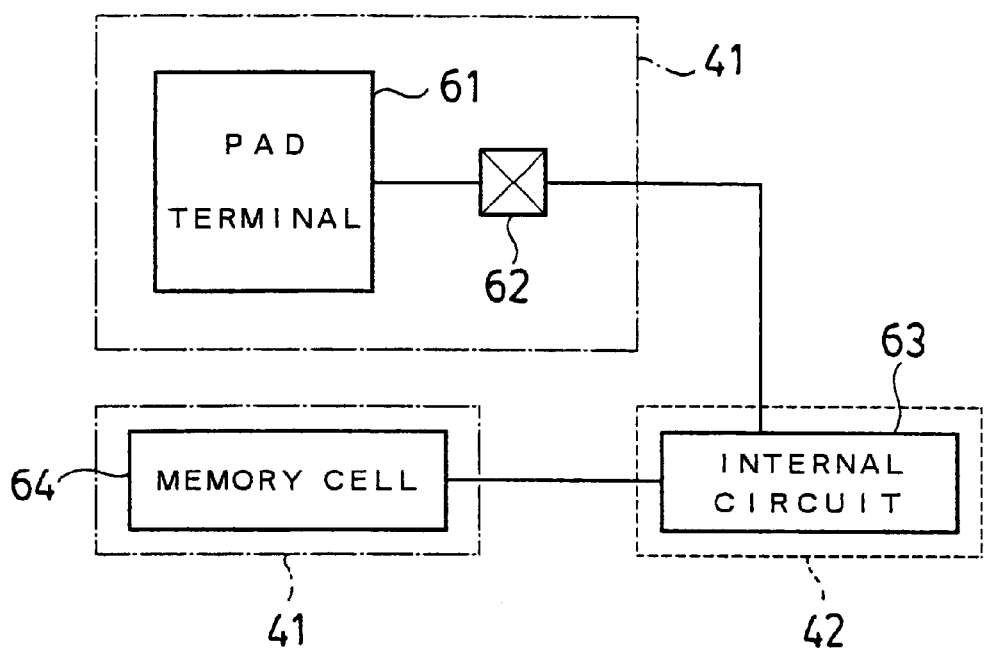
FIG. 7 is a circuit diagram of a non-volatile memory device which is an embodiment of the invention semiconductor device.

Embodiment of Semiconductor Non-volatile Memory Device: FIG. 7

FIG. 7 is a block circuit diagram of a semiconductor non-volatile memory device which is a sixth embodiment of the invention semiconductor device.

As shown in FIG. 7, the circuit of the semiconductor non-volatile memory device of this embodiment comprises a pad terminal 61 which is a section for connection with external devices, an input/output protection circuit 62 for preventing application of excessive voltage to the internal circuit, an internal circuit 63 constituted of an MOS semiconductor component, and a memory cell 64 constituted as a semiconductor nonvolatile memory cell.

The memory cell 64 and the input/output protection circuit 62 are formed at a first region and a third region in a thickly formed region 41 of the semiconductor layer on the insulating film of the SOI substrate (corresponding to the semiconductor layer 3 in FIGS. 1 to 6), while the internal circuit 63 is provided at a second region in a thinly formed region 42 of the semiconductor layer.

Since the memory cell 64 and the input/output protection circuit 62, which have high drive voltages, are provided in the thickly formed region 41, a bulk layer can be provided to conduct with the semiconductor layer at the channel region, thereby ensuring stable operation of the memory cell 64 and the input/output protection circuit 62.

Since the internal circuit 63 constituted of an MOS semiconductor component, which has a low drive voltage, is provided in the thinly formed region 42, the performance of the MOS semiconductor- component improves owing to the thinness of the semiconductor layer. Specifically, since the amount of depletion charge during operation is extremely limited, mobile carriers appear effectively in the channel region to enhance the current drive performance.

First Embodiment of Method of Fabricating Semiconductor Device: FIGS. 8 to 19 and FIG. 1

Embodiments of the method of fabricating the foregoing semiconductor devices will now be explained.

To begin with, a first embodiment relating to a method of fabricating the semiconductor device of FIG. 1, formed with an MOS semiconductor component, will be explained with reference to the sectional views of FIGS. 8 to 19.

Figure 8:
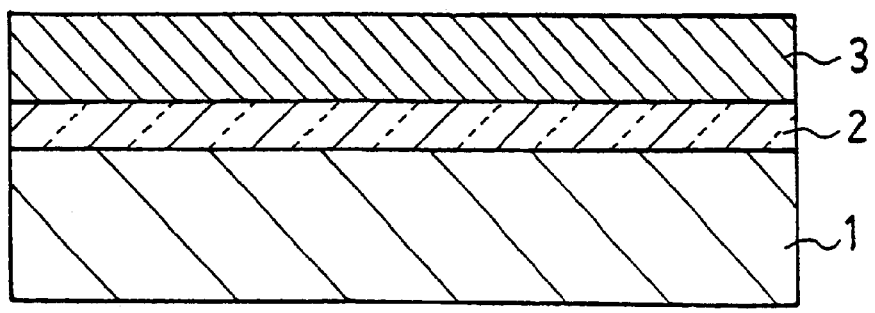
FIGS. 8 to 19 are sectional views for explaining an embodiment of a method of fabricating the semiconductor device shown in FIG. 1, each taken along the same plane as the view of FIG. 1 and showing the condition at a step in the fabrication process.

A P-type silicon single crystal substrate is used as the supporting substrate 1 shown in FIG. 8. The whole surface of the supporting substrate 1 is ion injected with oxygen ions under conditions of an ion implantation dose of $4 \times 10^{17}$ cm$^{-2}$ and an acceleration energy of 120 KeV. By this, oxygen ions are implanted only at the portion forming the insulating film 2 inside the silicon substrate.

The ion-implanted supporting substrate 1 is then subject to annealing at 1320° C. for 360 min. to form an $SiO_2$ insulating film inside the silicon substrate. This produces an SOI substrate (a so-called SIMOX (Separation by IMplanted OXygen) substrate) which, as shown in FIG. 8, comprises the supporting substrate 1, an 80-nm insulating film 2, and a 180-nm P-type semiconductor layer 3.

The invention semiconductor devices according to different embodiments of the invention can also be fabricated using commercially available SIMOX substrates.

The whole surface of the semiconductor layer 3 of the SIMOX substrate is coated with photosensitive resin (resist) by spin coating. The so-obtained photosensitive resin coating is then exposed through a prescribed photomask and developed to pattern it into a photosensitive resin film 50 covering only a thickly formed region 41, as shown in FIG. 9.

Figure 9:
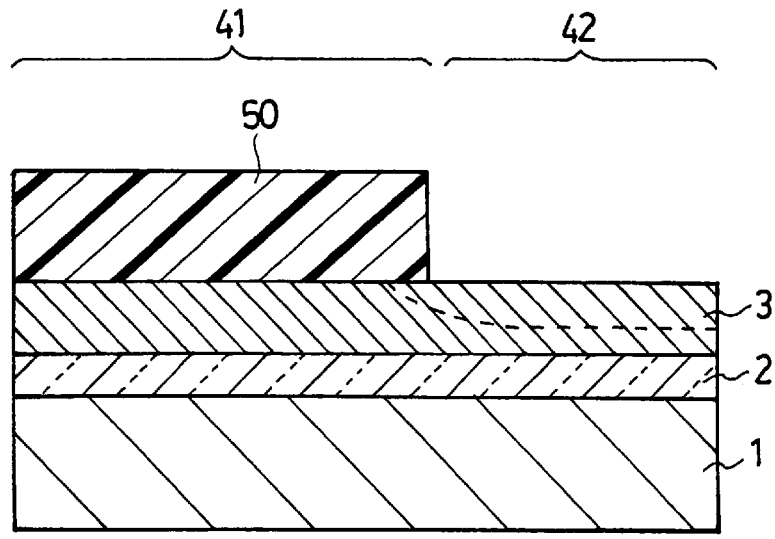

The photosensitive resin film 50 is then used as an etching mask for effecting isotropic etching of a thinly formed region 42 of the semiconductor layer 3 to a thickness of 80 nm, as indicated by the broken line in FIG. 9.

The isotropic etching of the semiconductor layer 3 is conducted with a reactive ion etching tool using a mixed gas of sulfur hexafluoride ($SF_6$), helium (He) and oxygen ($O_2$) as the etching gas.

After the semiconductor layer 3 has been etched, the photosensitive resin film 50 used as the etching mask is removed.

A thickly formed region 41 where the thickness of the semiconductor layer 3 is 180 nm and a thinly formed region 42 where the thickness of the semiconductor layer 3 is 80 nm can thus be obtained.

Moreover, side etching at the time of the isotropic etching gives the boundary region between the thinly formed region 42 and the thickly formed region 41 a sloped configuration of gradually changing thickness.

Figure 10:
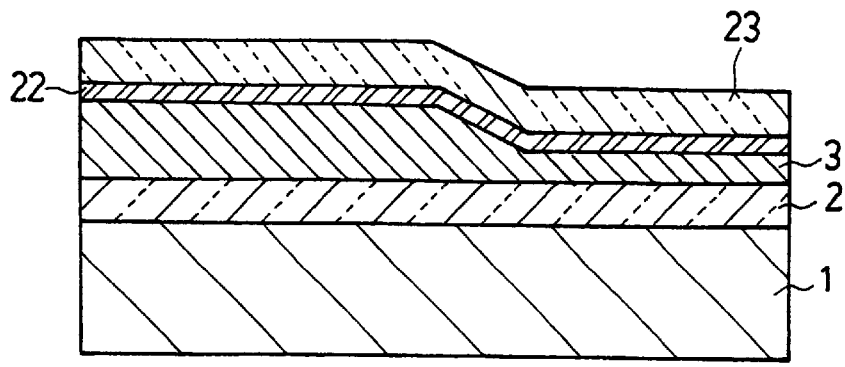

Next, as shown in FIG. 10, the semiconductor layer 3 is oxidized to form a 20-nm pad oxide film 22 made of silicon oxide.

The pad oxide film 22 formation conditions are: mixed gas atmosphere of oxygen and nitrogen, 1000° C. and 30 min.

An oxidation-resistant film 23 consisting of a 100-nm film of silicon nitride is then formed over the whole surface of the pad oxide film 22 by chemical vapor deposition using dichlorosilane ($SiH_2 Cl_2$) and ammonia ($NH_3$) as the reaction gas.

Figure 11:
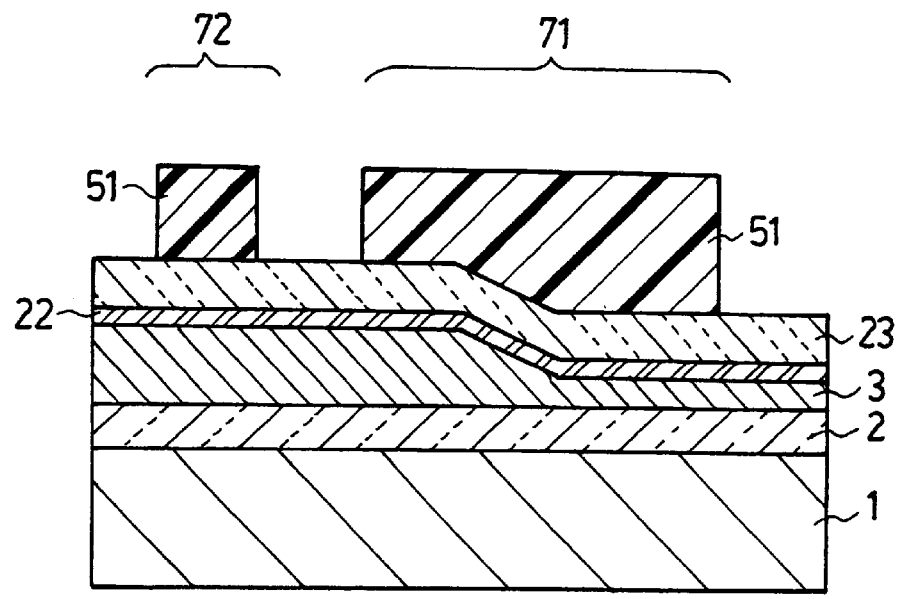

The whole surface of the oxidation-resistant film 23 is coated with photosensitive resin by spin coating. The so-obtained photosensitive resin coating is then exposed through a prescribed photomask and developed to pattern it into a photosensitive resin film 51 covering a component region 71 and a bulk layer region 72, as shown in FIG. 11.

Figure 12:
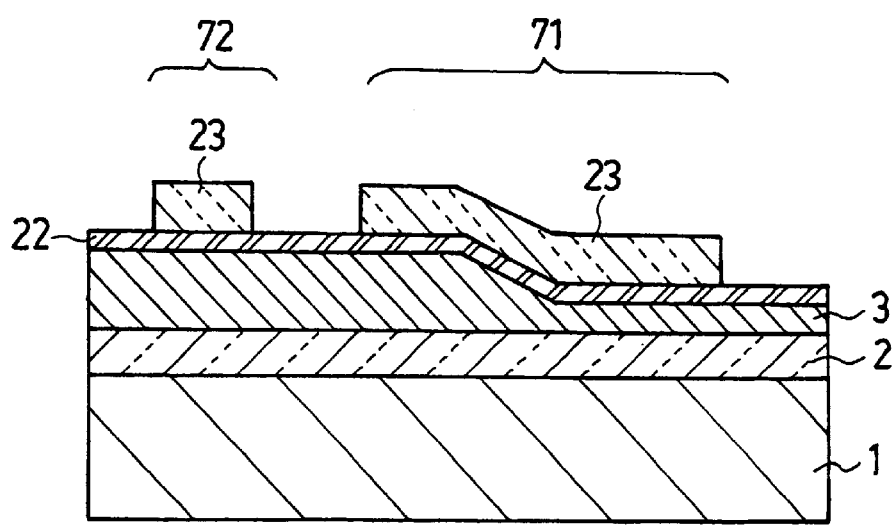

The oxidation-resistant film 23 made of silicon nitride is then patterned as shown in FIG. 12 using the photosensitive resin film 51 as an etching mask. Specifically, the oxidation-resistant film 23 at the component separation region is etched away.

The etching of the oxidation-resistant film 23 is conducted with a reactive ion etching tool using a mixed gas of sulfur hexafluoride ($SF_6$), helium (He) and trifluoromethane ($CHF_3$) as the etching gas. After the oxidation-resistant film 23 made of silicon nitride has been etched, the photosensitive resin film 51 is removed.

Figure 13:
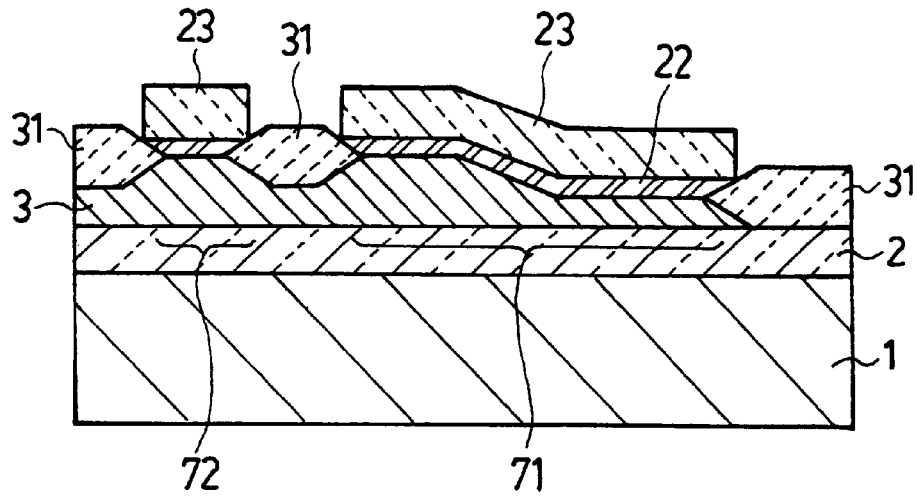

Next, selective oxidation (LOCOS) is effected using the oxidation-resistant film 23 as an oxidation preventing film to form a field oxide film 31 to a thickness of 180 nm at the component separation region surrounding the component region 71 and the bulk layer region 72, as shown in FIG. 13.

Owing to this selective oxidation, the field oxide film 31 contacts the insulating film 2 in the thinly formed region 42, while in the thickly formed region 41, the field oxide film 31 and the insulating film 2 are separated and the semiconductor layer 3 is present therebetween.

The selective oxidation conditions for forming the field oxide film 31 are: oxidative steam atmosphere, 950° C. and 40 min.

Figure 14:
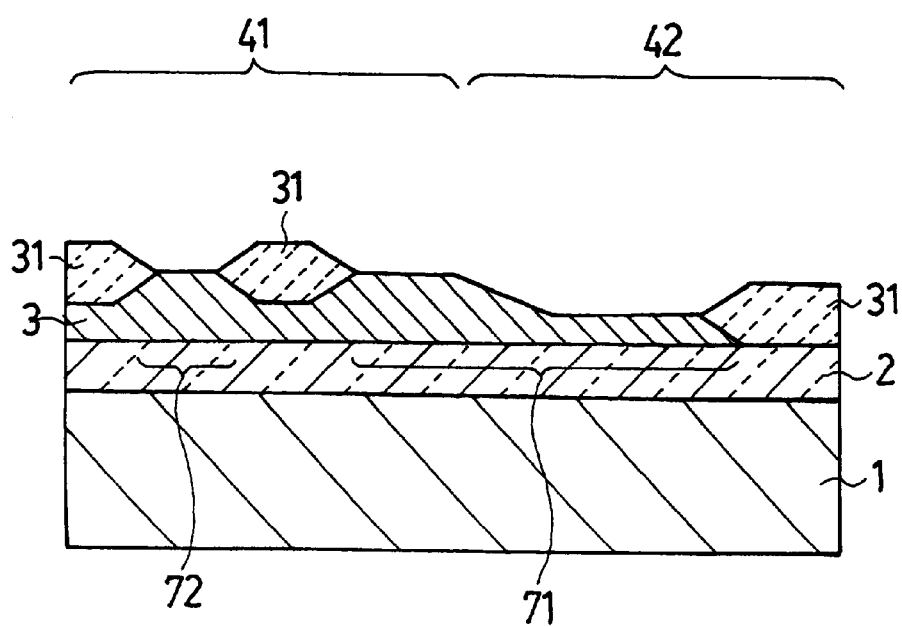

The oxidation-resistant film 23 used as the oxidation preventing film during selective oxidation is then removed with hot phosphoric acid. The pad oxide film 22 is thereafter removed by wet etching using a hydrofluoric acid-based etchant. The result is shown in FIG. 14.

Figure 15:
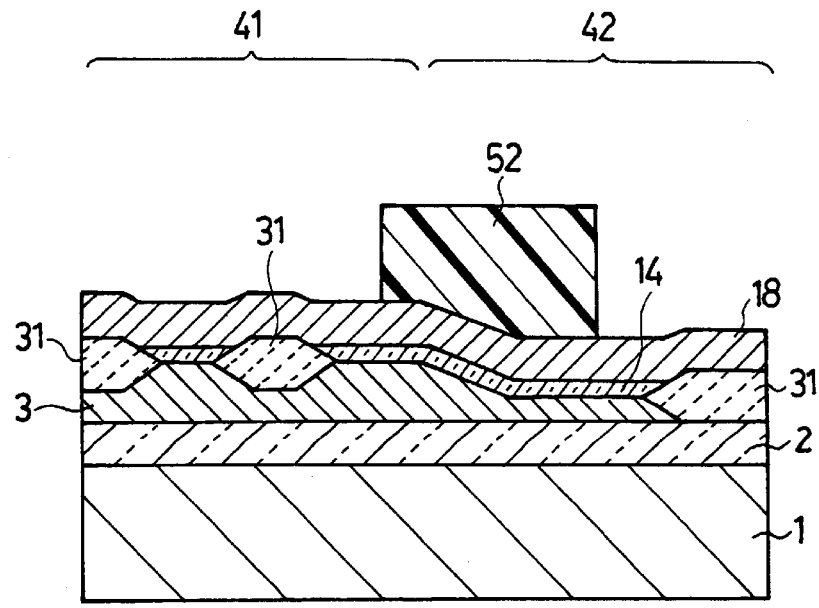

Next, as shown in FIG. 15, a gate oxide film 14 is formed on the semiconductor layer 3 to a thickness of about 20 nm.

The gate oxide film 14 formation conditions are: mixed gas atmosphere of oxygen and nitrogen, 1000° C. and 30 min.

Gate electrode material 18 consisting of a 400 nm polycrystalline silicon film is then formed over the whole surface by chemical vapor deposition using monosilane ($SiH_4$) as the reaction gas.

The whole surface of the gate electrode material 18 is coated with photosensitive resin by spin coating. The so-obtained photosensitive resin coating is then exposed through a prescribed photomask and developed to pattern a photosensitive resin film 52 in the shape of a gate 8.

Figure 16:
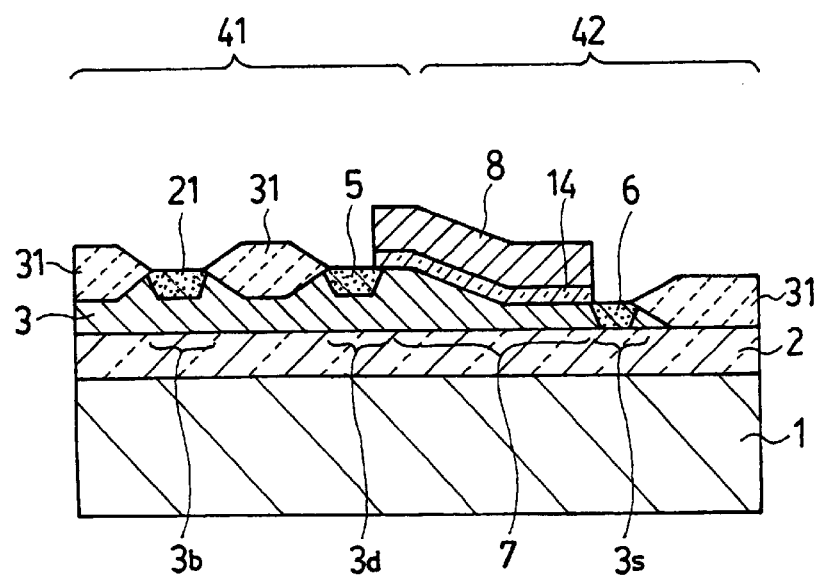

The gate electrode material 18 and the gate oxide film 14 are etched using the photosensitive resin film 52 as an etching mask to form the gate (electrode) 8 and pattern the gate oxide film 14 into the same shape as the gate 8, as shown in FIG. 16.

The etching of the gate 8 is conducted with a reactive ion etching tool using a mixed gas of sulfur hexafluoride ($SF_6$) and oxygen ($O_2$) as the etching gas.

Next, using photosensitive resin (not shown) as an ion implantation blocking film, arsenic (As), an impurity whose conductivity type (N-type) is opposite from that of the semiconductor layer 3, is introduced into a source region 3s and a drain region 3d of the semiconductor layer 3 self-aligned with the gate 8 to form high-concentration impurity layers that become a source 6 and a drain 5. A film of photosensitive resin (not shown) is formed to cover a bulk region 3b of the semiconductor layer 3.

The arsenic ion implantation for forming the high-concentration impurity layers constituting the source 6 and the drain 5 is conducted at a dose of about $3 \times 10^{15}$ $cm^{-2}$.

Using photosensitive resin (not shown) as an ion implantation blocking film, boron (B), an impurity whose conductivity type (P-type) is the same as that of the semiconductor layer 3, is introduced into the bulk region 3b of the semiconductor layer 3 to form a high-concentration impurity layer that becomes a bulk layer (bulk contact) 21. The film of photosensitive resin at this time is formed to cover the source 6 and the drain 5.

The boron ion implantation for forming the high-concentration impurity layers constituting the bulk layer 21 is conducted at a dose of about $3 \times 10^{15}$ $cm^{-2}$.

The impurity ions implanted in the high-concentration impurity layers of the source 6, the drain 5 and the bulk layer 21 are thereafter activated by effecting thermal annealing in a nitrogen atmosphere at 800° C. for 15 min.

Owing to this thermal annealing, the high-concentration impurity layer of the source 6 contacts the insulating film 2, while the high-concentration impurity layer of the drain 5 and the high-concentration impurity layer of the bulk layer 21 do not contact the insulating film 2.

Figure 17:
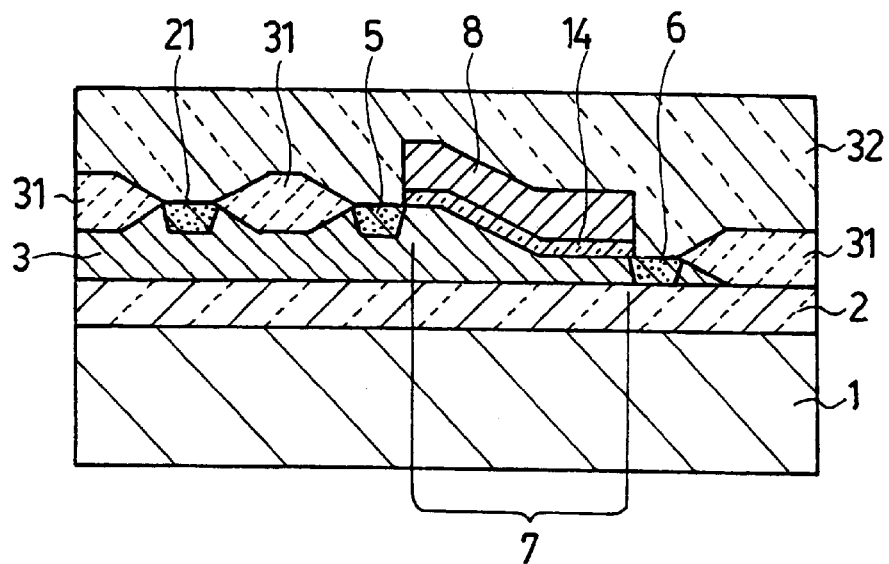

Next, as shown in FIG. 17, an interlevel insulator film 32 consisting of a silicon oxide film containing phosphorus and boron is formed over the whole surface to a thickness of about 400 nm by chemical vapor deposition.

Figure 18:
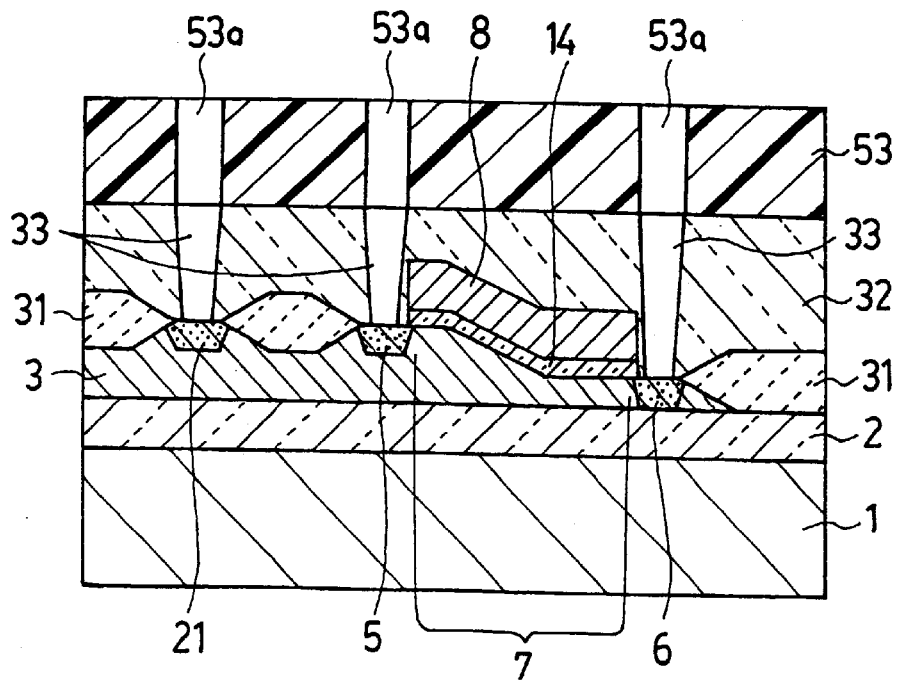

The whole surface of the interlevel insulator film 32 is coated with photosensitive resin by spin coating. The so-obtained photosensitive resin coating is then exposed through a prescribed photomask and developed to pattern a photosensitive resin film 53 having openings corresponding to contact holes 33, as shown in FIG. 18.

The interlevel insulator film 32 is then etched using the patterned photosensitive resin film 53 as an etching mask to form contact holes 33 at positions corresponding to the source 6, the drain 5, the gate 8 and the bulk layer 21. The contact hole for the gate 8 is at a different sectional position not shown in FIG. 18.

The etching of the contact holes 33 is conducted with a reactive ion etching tool using a mixed gas of trifluoromethane ($CHF_3$) and difluoromethane ($CH_2F_2$) as the etching gas.

Figure 19:
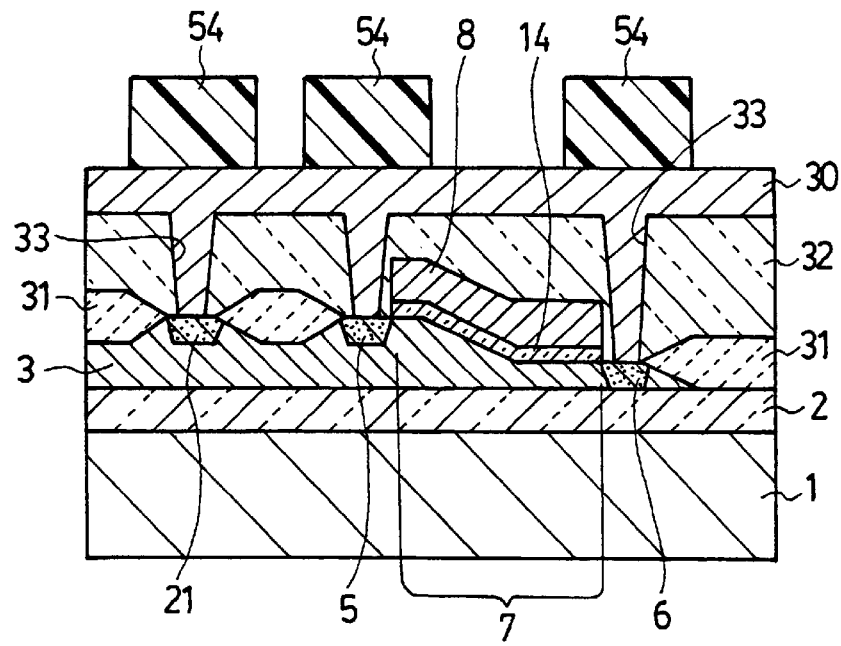

A sputtering apparatus is then used to form interconnecting material 30 made of aluminum containing silicon and copper inside the contact holes 33 and to a thickness of around 800 nm over the whole surface of the interlevel insulator film 32, as shown in FIG. 19.

Next, a film of photosensitive resin formed on the interconnecting material 30 by spin coating is exposed through a prescribed photomask and developed to pattern a photosensitive resin film 54 into a pattern corresponding to interconnecting electrodes, as shown in FIG. 19.

The interconnecting material 30 is then etched using the patterned photosensitive resin film 54 as a mask to form the interconnecting electrodes 34, 35 and 36 connected with the source 6, the drain 5, the gate 8 and the bulk contact 21 as shown in FIG. 1 (the interconnecting electrode connected with the gate 8 is not shown).

The etching of the interconnecting material 30 is conducted with a reactive ion etching tool using a mixed gas of chlorine ($Cl_2$) and boron trichloride ($BCl_3$) as the etching gas.

In this way, as shown in FIG. 1, a semiconductor device formed with an MOS semiconductor component can be fabricated wherein the semiconductor layer 3 is thicker on the drain 5 side than on the side of the channel region 7 near the source 6 and the thickness of the semiconductor layer 3 gradually changes at the region within the channel region 7 constituting the boundary region thereof with the drain region.

The fabrication method described in the foregoing can be adapted for fabrication of the semiconductor device shown in FIG. 2 merely by reversing the positions at which the source 6 and the drain 5 of the MOS semiconductor component are formed on the semiconductor layer 3, i.e., by reversing the source and drain regions of the semiconductor layer 3.

The fabrication method can be adapted for fabrication of the semiconductor device shown in FIG. 3 by conducting the etching of the semiconductor layer 3 for forming the 180-nm thickly formed region 41 and the 80-nm thinly formed region 42 so that the thinly formed region 42 is at the middle portion of the channel region and includes regions that change gradually in thickness on either side thereof, and further forming both the source region and the drain region in the thickly formed region 41.

Second Embodiment of Method of Fabricating Semiconductor Device: FIGS. 20 to 22 and FIG. 4

A second embodiment relating to a method of fabricating the invention semiconductor device of FIG. 4, formed with a semiconductor non-volatile memory cell, will now be explained with reference to the sectional views of FIGS. 20 to 22.

The steps of the foregoing first embodiment explained with reference to FIGS. 8 to 14 are also utilized in the second embodiment. These steps form the semiconductor layer 3 on the supporting substrate 1 with the thickly formed region 41 and the thinly formed region 42, and further form the field oxide film 31 to a thickness of 180 nm at the component separation region surrounding the component region and the bulk layer region.

Figure 20:
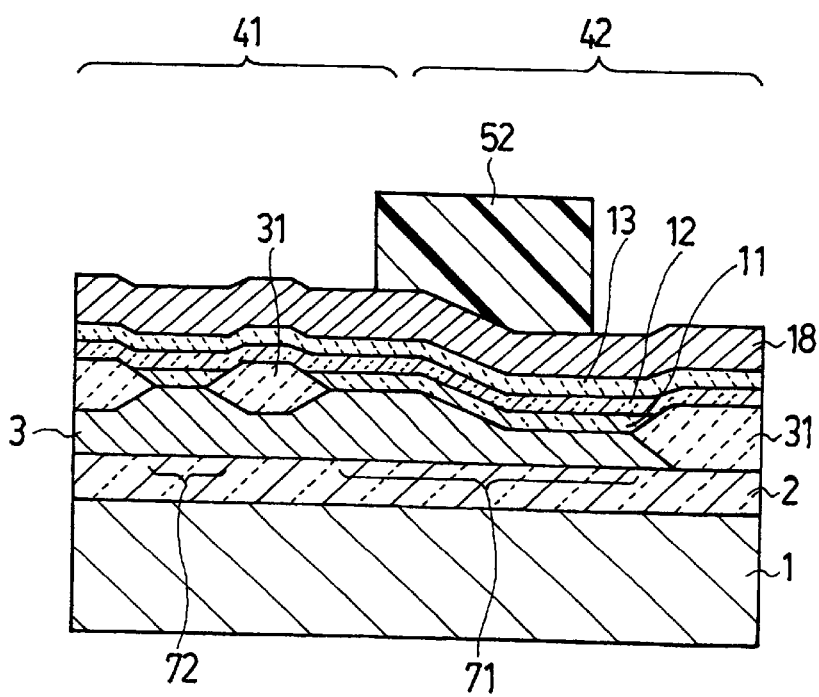
FIGS. 20 to 22 are sectional views for explaining an embodiment of a method of fabricating the semiconductor device shown in FIG. 4, each taken along the same plane as the view of FIG. 4 and showing the condition at some steps in the fabrication process.

Next, as shown in FIG. 20, a tunnel oxide film 11 made of silicon oxide is formed on the semiconductor layer 3 to a thickness of 2 nm by an oxidation treatment.

The tunnel oxide film 11 formation conditions are: mixed gas atmosphere of oxygen and nitrogen, 850° C. and 20 min.

An 11-nm silicon nitride film 12 is then formed over the whole surface of the tunnel oxide film 11 by chemical vapor deposition using dichlorosilane and ammonia as the reaction gas.

A top oxide film 13 made of silicon oxide is further formed on the silicon nitride film 12 by effecting oxidation in an oxidative steam atmosphere at 900° C. for 60 min.

The formation of the top oxide film 13 on the silicon nitride film 12 reduces the thickness of silicon nitride film 12 from the original 11 nm to 8 nm.

Gate electrode material 18 consisting of a 400 nm polycrystalline silicon film is then formed over the whole surface by chemical vapor deposition using monosilane ($SiH_4$) as the reaction gas.

The whole surface of the gate electrode material 18 is coated with photosensitive resin by spin coating. The so-obtained photosensitive resin coating is then exposed through a prescribed photomask and developed to pattern a photosensitive resin film 52 in the shape of a gate 8.

Figure 21:
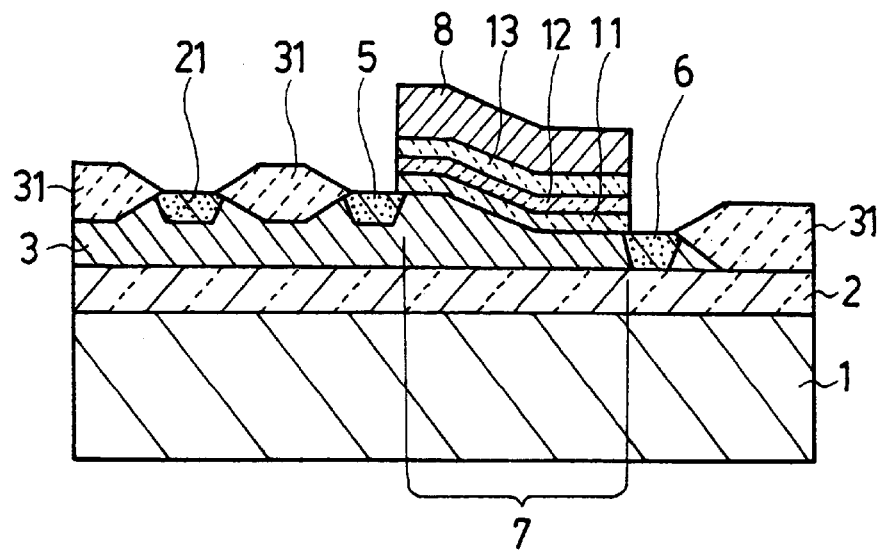

The gate electrode material 18 is etched using the photosensitive resin film 52 as an etching mask to form the gate 8 and then pattern the top oxide film 13, the silicon nitride film 12 and the tunnel oxide film 11 into the same shape as the gate 8, as shown in FIG. 21.

The etching of the gate electrode material 18 and the like is conducted with a reactive ion etching tool using a mixed gas of sulfur hexafluoride ($SF_6$) and oxygen ($O_2$) as the etching gas.

Next, using photosensitive resin (not shown) as an ion implantation blocking film, arsenic (As), an impurity whose conductivity type is opposite from that of the semiconductor layer 3, is introduced into the thickly formed region and the thinly formed region of the semiconductor layer 3 self-aligned on opposite sides of the gate 8 to form high-concentration impurity layers that become a source 6 and a drain 5. The film of photosensitive resin at this time is formed to cover a region of the semiconductor layer 3 to be formed with a bulk layer 21.

The arsenic ion implantation for forming the high-concentration impurity layer constituting the source 6 and the drain 5 is conducted at a dose of about $3 \times 10^{15}$ $cm^{-2}$.

Using photosensitive resin (not shown) as an ion implantation blocking film, boron (B), an impurity whose conductivity type is the same as that of the semiconductor layer 3, is introduced into the bulk region in the thickly formed region of the semiconductor layer 3 to form a high-concentration impurity layer that becomes the bulk layer 21. The film of photosensitive resin at this time is formed to cover the source 6 and the drain 5.

The boron ion implantation for forming the high-concentration impurity layer constituting the bulk layer 21 is conducted at a dose of about $3 \times 10^{15}$ $cm^{-2}$.

Figure 22:
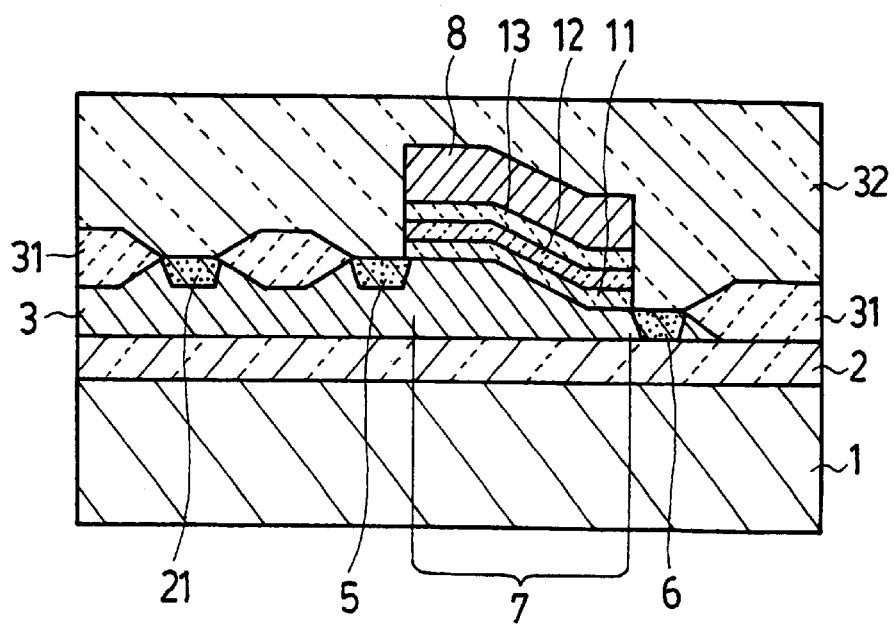

Next, as shown in FIG. 22, an interlevel insulator film 32 consisting of a silicon oxide film containing phosphorus and boron is formed over the whole surface.

The impurity ions implanted in the high-concentration impurity layers of the source 6, the drain 5 and the bulk layer 21 are activated by effecting thermal annealing in a nitrogen atmosphere at 800° C. for 15 min.

Owing to this thermal annealing, the high-concentration impurity layer of the source 6 contacts the insulating film 2, while the high-concentration impurity layer of the drain 5 and the high-concentration impurity layer of the bulk contact 21 do not contact the insulating film 2.

Processing steps like those of the first embodiment explained with reference to FIGS. 18 and 19 are then conducted to form the contact holes 33 shown in FIG. 4 and form interconnecting electrodes 34, 35 and 36 passing through the contact holes 33 to connect with the source 6, the drain 5, the bulk layer 21 and the gate 8 (the interconnecting electrode connected with the gate 8 is not shown in FIG. 4), thereby completing a semiconductor device formed with the MONOS semiconductor non-volatile memory cell shown in FIG. 4.

In this semiconductor device, the semiconductor layer 3 is thicker on the drain 5 side than on the side of the channel region 7 near the source 6.

The fabrication method described in the foregoing can be adapted for fabrication of the semiconductor device shown in FIG. 5 merely by reversing the positions at which the source 6 and the drain 5 of the MONOS semiconductor non-volatile memory cell are formed on the semiconductor layer 3, i.e., by reversing the source and drain regions of the semiconductor layer 3.

The fabrication method can be adapted for fabrication of the semiconductor device shown in FIG. 6 by conducting the etching of the semiconductor layer 3 for forming the 180-nm thickly formed region 41 and the 80-nm thinly formed region 42 so that the thinly formed region 42 is at the middle portion of the channel region and includes regions that change gradually in thickness on opposite sides thereof, and further forming both the source region and the drain region in the thickly formed region 41.

Further, an MNOS semiconductor non-volatile memory cell can be fabricated by forming the tunnel oxide film 11, the silicon nitride film 12 and the top oxide film 13 on the semiconductor layer 3 as explained with reference to FIG. 20 and, in the step for forming the gate electrode material 18 thereon, forming the gate electrode material 18 without forming the top oxide film 13.

Third Embodiment of Method of Fabricating Semiconductor Device: FIGS. 23 to 36 and FIG. 7

A third embodiment relating to a method of fabricating the invention semiconductor device of FIG. 7, formed with a semiconductor non-volatile memory device, will now be explained with reference to the sectional views of FIGS. 23 to 36.

Figure 23:
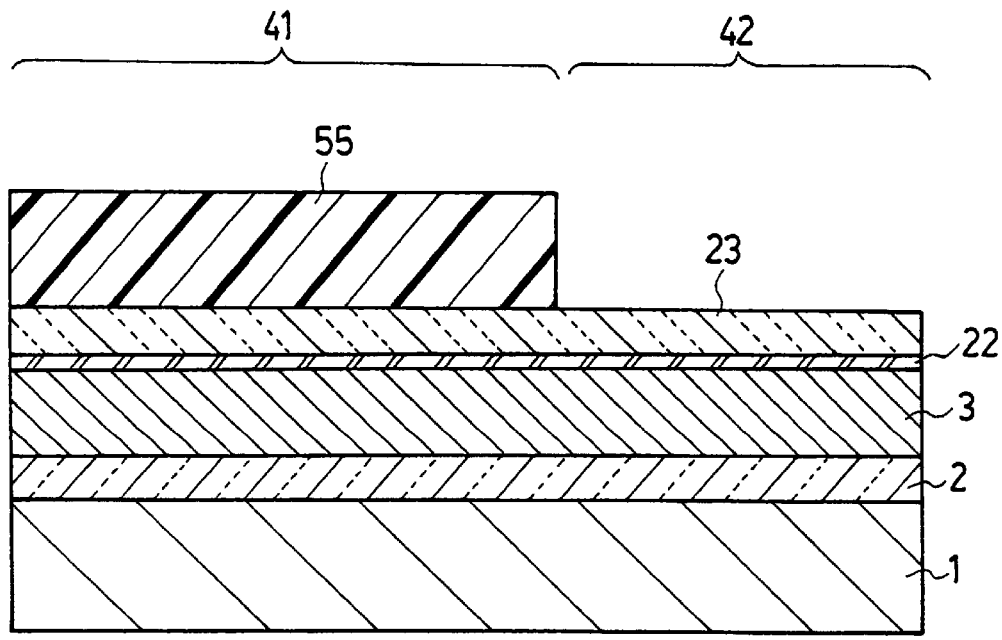
FIGS. 23 to 36 are schematic sectional views for explaining an embodiment of a method of fabricating the semiconductor device shown in FIG. 7, each showing the condition at a step in the fabrication process.

A SIMOX substrate having a supporting substrate 1, an 80-nm insulating film 2 and a 180-nm P-type semiconductor layer 3, as shown in FIG. 23, is fabricated by the same processing steps as those explained earlier with reference to FIG. 8 regarding the first embodiment. Alternatively, a commercially available SIMOX substrate of this structure can be used.

A pad oxide film 22 made of silicon oxide is formed on the semiconductor layer 3 of the SIMOX substrate to a thickness of 20 nm.

The pad oxide film 22 formation conditions are: mixed gas atmosphere of oxygen and nitrogen, 1000° C. and 30 min.

An oxidation-resistant film 23 consisting of a 100-nm film of silicon nitride is then formed over the whole surface of the pad oxide film 22 by chemical vapor deposition using dichlorosilane ($SiH_2Cl_2$) and ammonia ($NH_3$) as the reaction gas.

The whole surface of the oxidation-resistant film 23 is coated with photosensitive resin by spin coating. The so-obtained photosensitive resin coating is then exposed through a prescribed photomask and developed to pattern it into a photosensitive resin film 55 on the thickly formed region 41 shown in FIG. 23.

Figure 24:
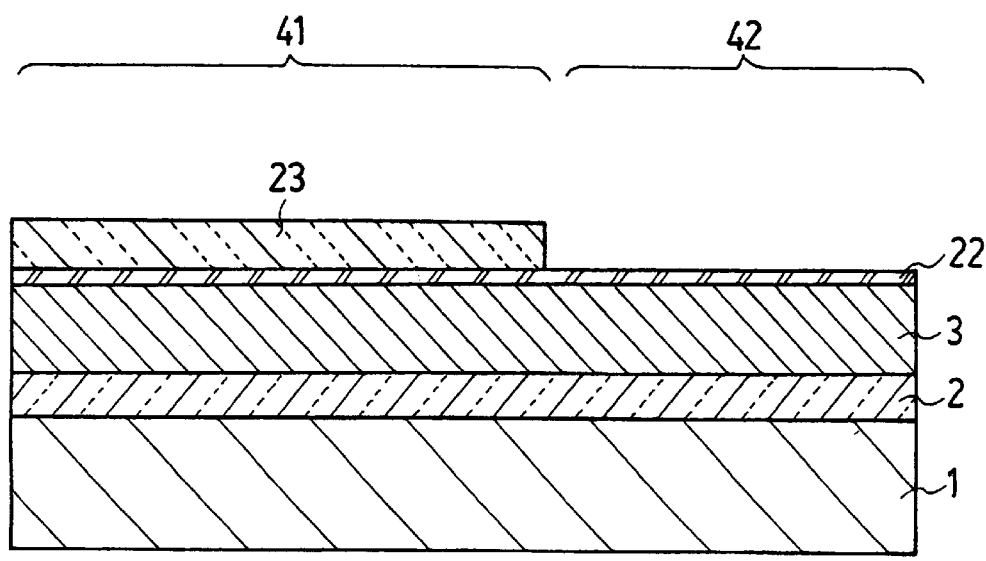

The oxidation-resistant film 23 made of silicon nitride is then pattern using the patterned photosensitive resin film 55 as an etching mask. Specifically, the oxidation-resistant film 23 at the thinly formed region 42 is etched away, as shown in FIG. 24.

The etching of the oxidation-resistant film 23 is conducted with a reactive ion etching tool using a mixed gas of sulfur hexafluoride ($SF_6$), helium (He) and trifluoromethane ($CHF_3$) as the etching gas.

After the oxidation-resistant film 23 made of silicon nitride has been etched, the photosensitive resin film 55 used as the etching mask is removed.

Figure 25:
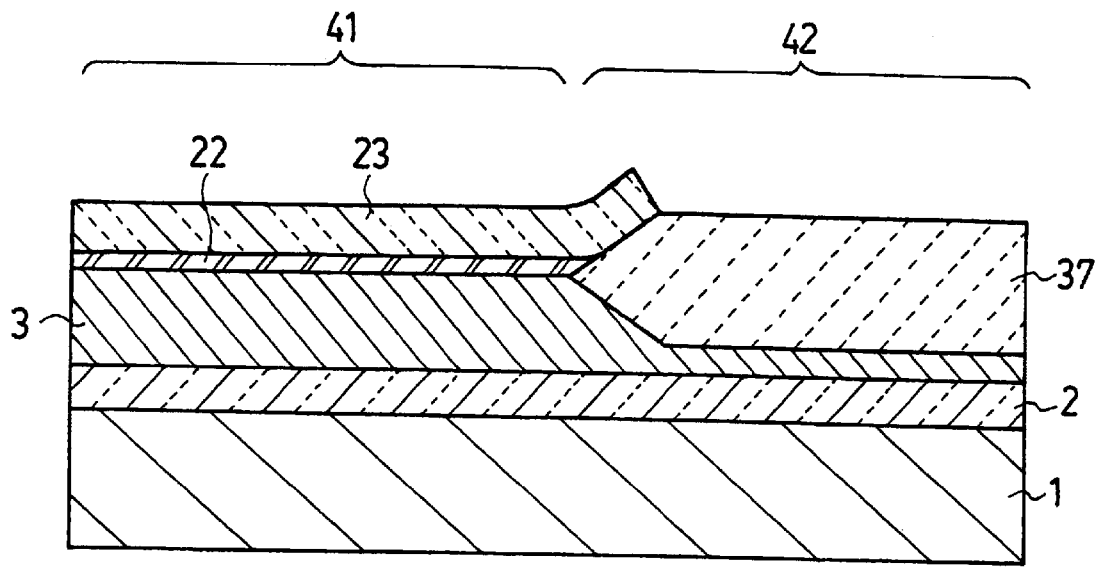
Figure 26:
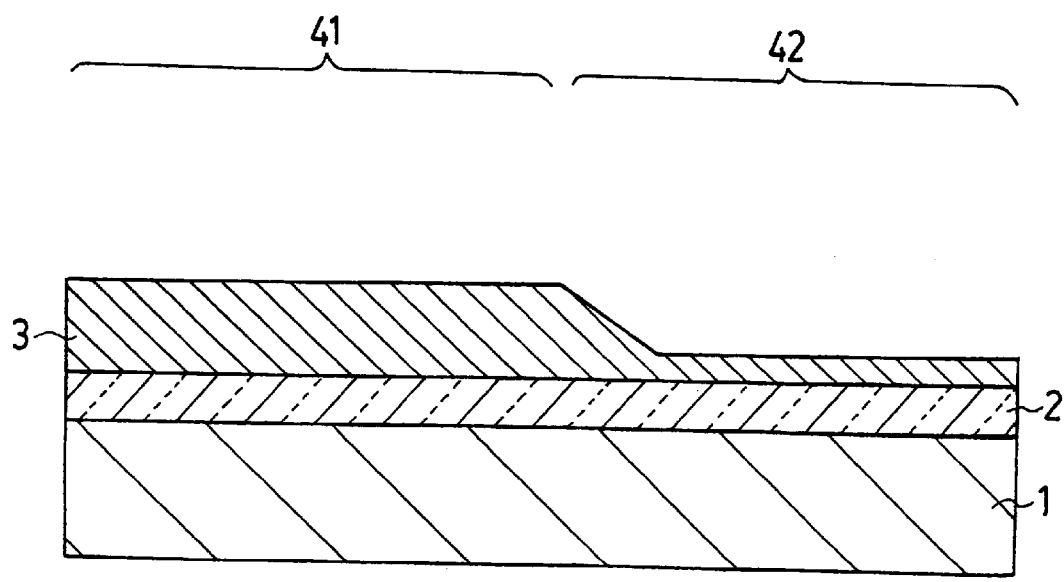

Next, selective oxidation (LOCOS) is effected using the oxidation-resistant film 23 as an oxidation preventing film to form a field oxide film 37 on the thinly formed region 42 to a thickness of 220 nm, as shown in FIG. 25.

The selective oxidation conditions for forming the field oxide film 37 are: oxidative steam atmosphere, 950° C. and 50 min.

The oxidation-resistant film 23 used as the oxidation preventing film during selective oxidation is then removed with phosphoric acid. The pad oxide film 22 and the field oxide film 37 are thereafter removed by wet etching using a hydrofluoric acid-based etchant.

Owing to the removal of the field oxide film 37, the thickness of the semiconductor layer 3 at the thinly formed region 42 becomes 80 nm and the thickness of the semiconductor layer 3 at the thickly formed region 41 becomes 170 nm. The thickness of the semiconductor layer 3 at the boundary region between the thickly formed region 41 and the thinly formed region 42 changes gradually.

Figure 27:
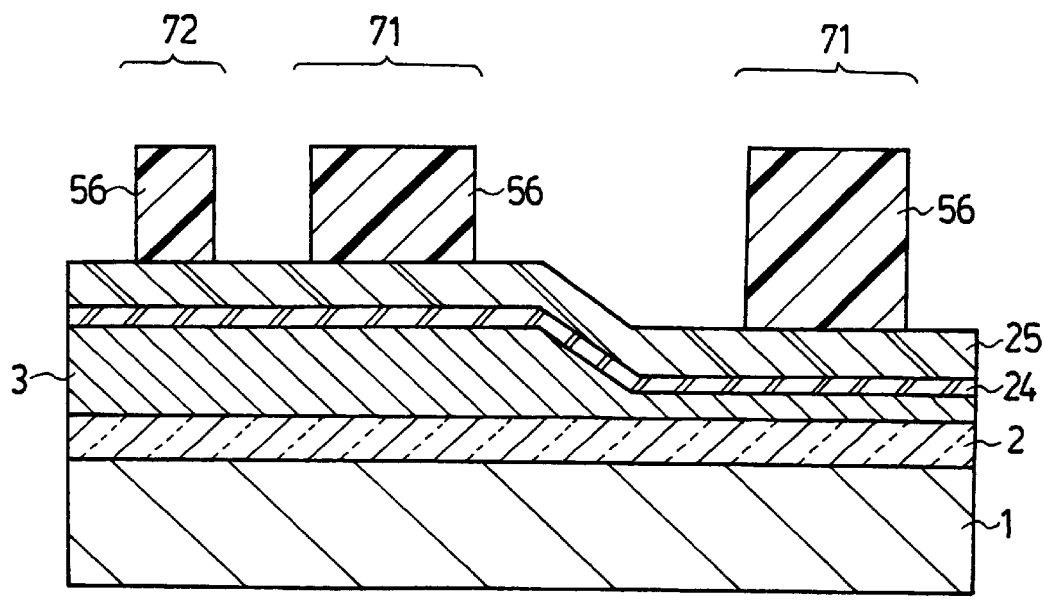

A pad oxide film 24 made of silicon oxide is formed on the semiconductor layer 3 of the supporting substrate 1 to a thickness of 20 nm, as shown in FIG. 27.

The pad oxide film 24 formation conditions are: mixed gas atmosphere of oxygen and nitrogen, 1000° C. and 30 min.

An oxidation-resistant film 25 consisting of a 100-nm film of silicon nitride is then formed over the whole surface of the pad oxide film 24 by chemical vapor deposition using dichlorosilane ($SiH_2Cl_2$) and ammonia ($NH_3$) as the reaction gas.

The whole surface of the oxidation-resistant film 25 is coated with photosensitive resin by spin coating. The so-obtained photosensitive resin coating is then exposed through a prescribed photomask and developed to pattern it into a photosensitive resin film 56 on a component region 71 and a bulk layer region 72.

Figure 28:
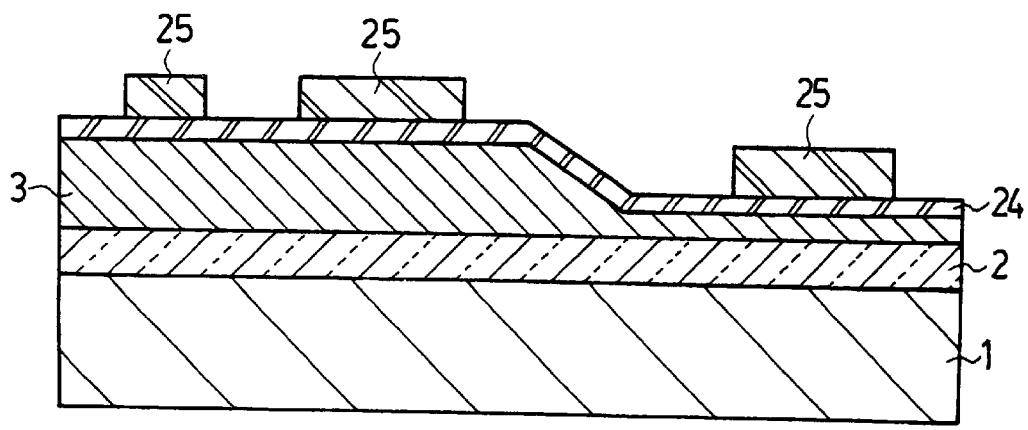

The oxidation-resistant film 25 made of silicon nitride is then patterned using the patterned photosensitive resin film 56 as an etching mask. Specifically, the oxidation-resistant film 25 at the component separation region is etched away, as shown in FIG. 28.

The etching of the oxidation-resistant film 25 is conducted with a reactive ion etching tool using a mixed gas of sulfur hexafluoride ($SF_6$), helium (He) and trifluoromethane ($CHF_3$) as the etching gas.

After the oxidation-resistant film 25 made of silicon nitride has been etched, the photosensitive resin film 56 used as the etching mask is removed.

Figure 29:
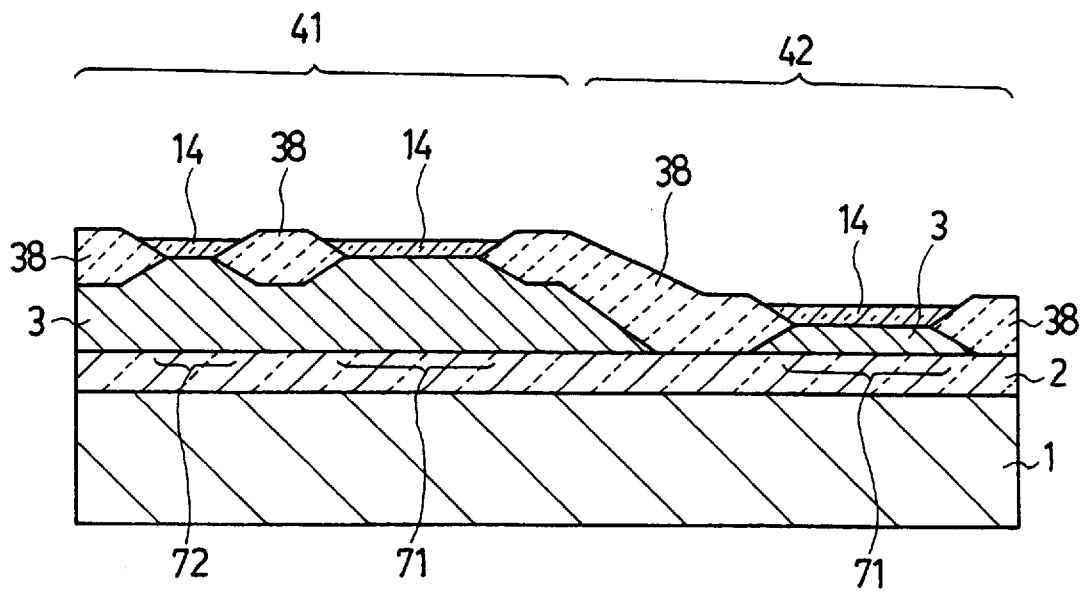

Next, selective oxidation is effected using the oxidation-resistant film 25 as an oxidation preventing film to form a field oxide film 38 to a thickness of 220 nm at the component separation region surrounding the component region 71 and the bulk layer region 72, as shown in FIG. 29.

The selective oxidation conditions for forming the field oxide film 38 are: oxidative steam atmosphere, 950° C. and 40 min.

The oxidation-resistant film 25 used as the oxidation preventing film during selective oxidation is then removed with hot phosphoric acid. The pad oxide film 24 is thereafter removed by wet etching using a hydrofluoric acid-based etchant. The result of removing the oxidation-resistant film 25 and the pad oxide film 24 is shown in FIG. 29.

Owing to this selective oxidation, the field oxide film 38 contacts the insulating film 2 in the thinly formed region 42, while in the thickly formed region 41, the field oxide film 38 is apart from the insulating film 2 and the semiconductor layer 3 is present therebetween.

Next, a gate oxide film 14 consisting of silicon oxide is formed on the semiconductor layer 3 to a thickness of about 20 nm.

The gate oxide film 14 formation conditions are: mixed gas atmosphere of oxygen and nitrogen, 1000° C. and 30 min.

Figure 30:
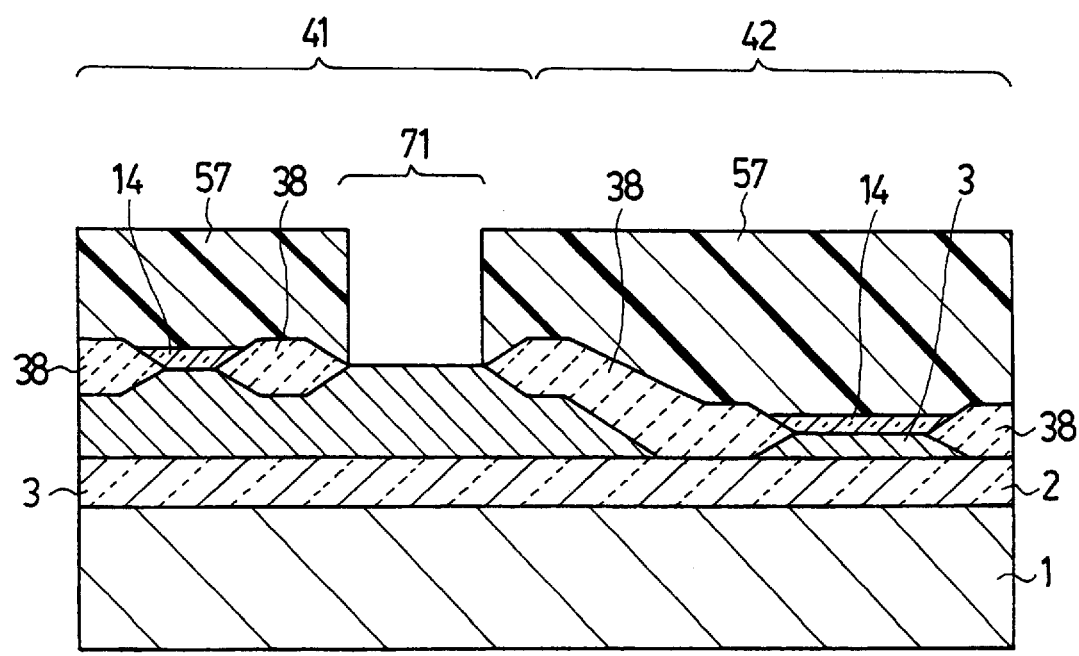

The whole surface of the fabricating device is coated with photosensitive resin by spin coating. The so-obtained photosensitive resin coating is then exposed through a prescribed photomask and developed to pattern a photosensitive resin film 57 open at the component region 71 in the thickly formed region 41, as shown in FIG. 30.

Using the photosensitive resin film 57 as an etching mask, the gate oxide film 14 at the component region 71 in the thickly formed region 41 is removed by wet etching using a hydrofluoric acid-based etchant. The photosensitive resin film 57 used as the etching mask is then removed.

Figure 31:
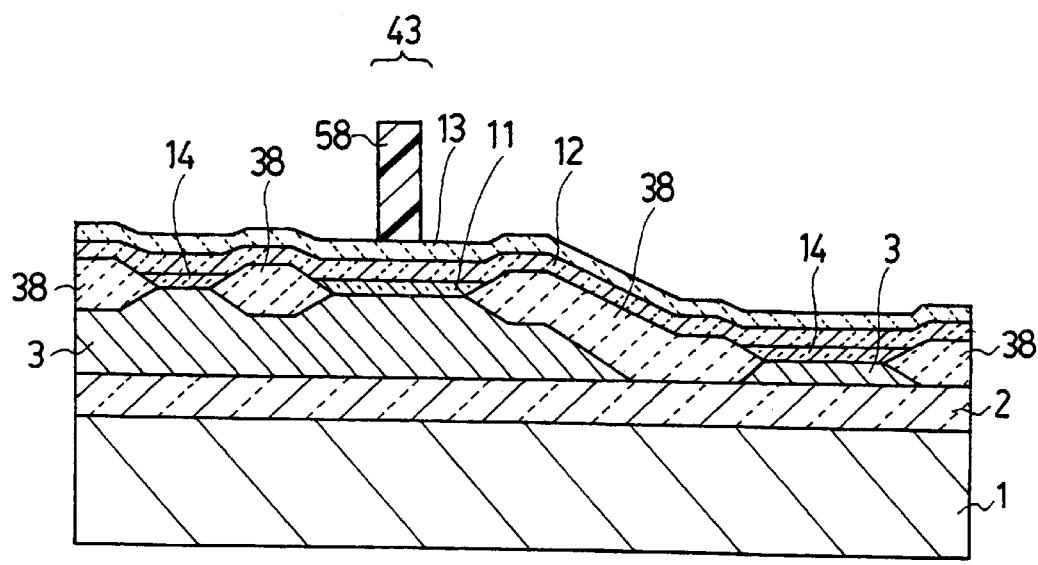

Next, as shown in FIG. 31, a tunnel oxide film 11 made of silicon oxide is formed on the exposed portion of the semiconductor layer 3 to a thickness of 2 nm by an oxidation treatment.

The tunnel oxide film 11 formation conditions are: mixed gas atmosphere of oxygen and nitrogen, 850° C. and 20 min.

An 11-nm silicon nitride film 12 is then formed over the whole surface of the tunnel oxide film 11 by chemical vapor deposition using dichlorosilane and ammonia as the reaction gas.

A top oxide film 13 made of silicon oxide is further formed over the whole surface of the silicon nitride film 12 by effecting oxidation in an oxidative steam atmosphere at 900° C. for 60 min.

The formation of the top oxide film 13 on the silicon nitride film 12 reduces the thickness of silicon nitride film 12 from the original 11 nm to 8 nm.

The whole surface of the top oxide film 13 is coated with a photosensitive resin 58 by spin coating. The so-obtained photosensitive resin coating 58 is then exposed through a prescribed photomask and developed to pattern a photosensitive resin film 58 remaining only at a memory gate formation region 43, as shown in FIG. 31.

Figure 32:
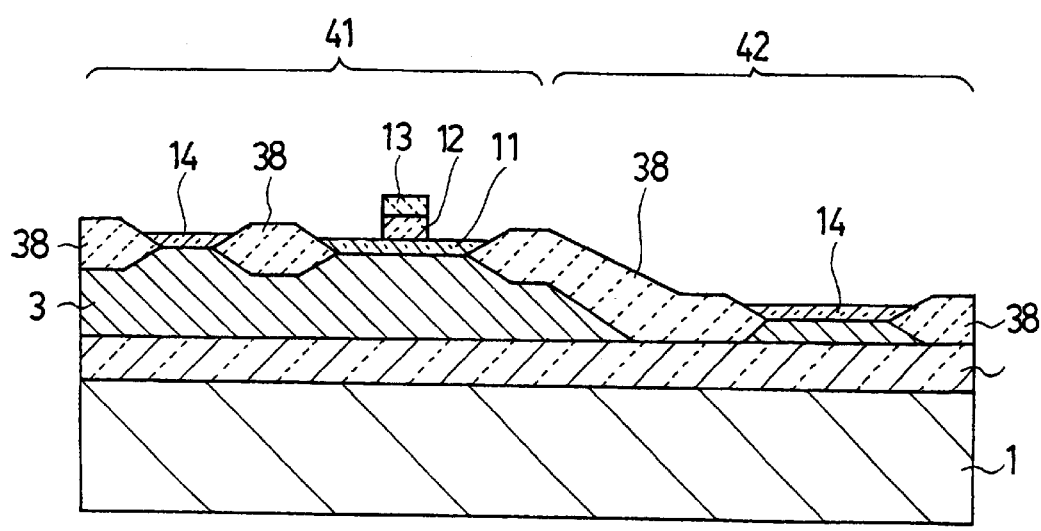

The top oxide film 13 and the silicon nitride film 12 are then etched as shown in FIG. 32, using the photosensitive resin film 58 as an etching mask.

The etching of the top oxide film 13 and the silicon nitride film 12 is conducted with a reactive ion etching tool using a mixed gas of sulfur hexafluoride ($SF_6$), helium (He) and trifluoromethane ($CHF_3$) as the etching gas.

After the top oxide film 13 and the silicon nitride film 12 have been etched, the photosensitive resin film 58 used as the etching mask is removed.

Figure 33:
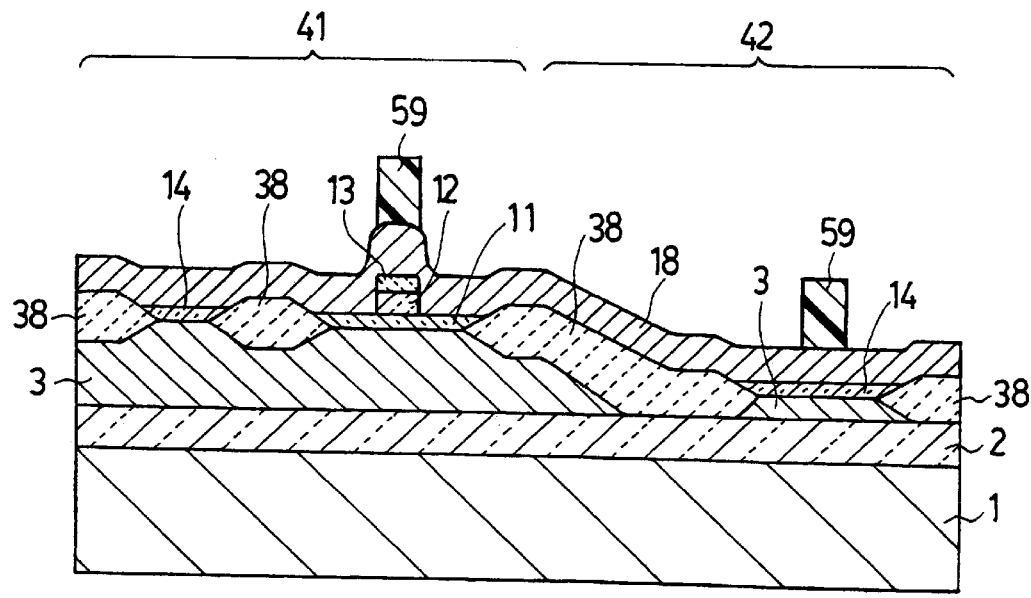

Gate electrode material 18 consisting of a 400 nm polycrystalline silicon film is then formed over the whole surface by chemical vapor deposition using monosilane ($SiH_4$) as the reaction gas, as shown in FIG. 33.

The whole surface of the gate electrode material 18 is coated with photosensitive resin by spin coating. The so-obtained photosensitive resin coating is then exposed through a prescribed photomask and developed to pattern a photosensitive resin film 59 in the shape of the gate of an MONOS semiconductor non-volatile memory cell constituting the memory cell 64 shown in FIG. 7 and the gate of an MOS semiconductor component constituting the internal circuit 63 shown in the same figure.

Figure 34:
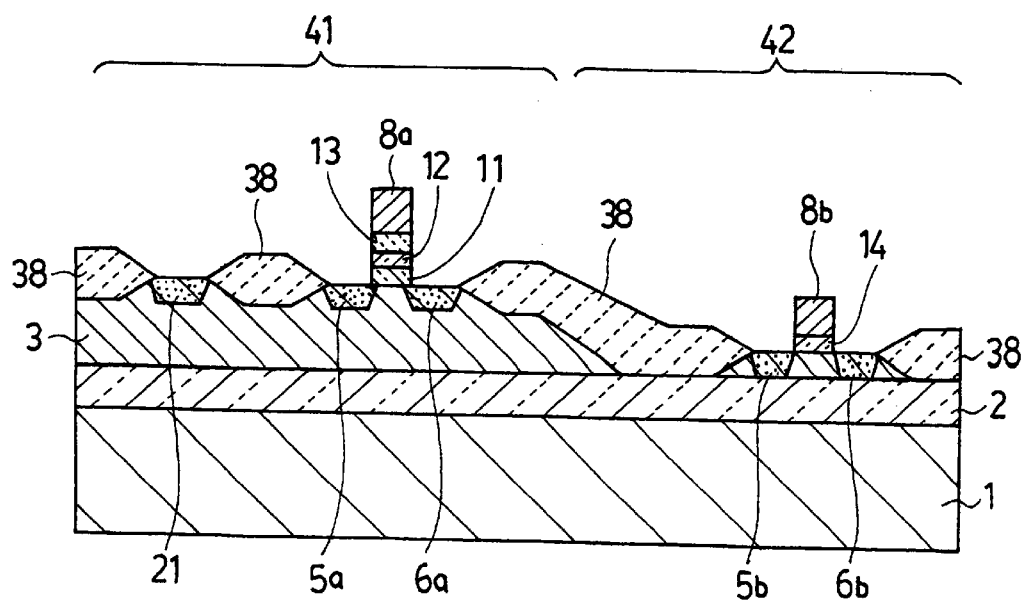

The gate electrode material 18 is patterned using the patterned photosensitive resin film 59 as an etching mask to form gates 8a, 8b, as shown in FIG. 34. At this time, unnecessary portions of the gate oxide film 14 and the tunnel oxide film 11 remaining on the semiconductor layer 3 are also etched away.

The etching of the gate electrode material 18 is conducted with a reactive ion etching tool using a mixed gas of sulfur hexafluoride ($SF_6$) and oxygen ($O_2$) as the etching gas.

Next, using photosensitive resin (not shown) as an ion implantation blocking film, arsenic (As), an impurity whose conductivity type is opposite from that of the semiconductor layer 3, is introduced into the source region and drain region of the semiconductor layer 3 self-aligned on opposite sides of each of the gates 8a, 8b to form high-concentration impurity layers that become sources 6a, 6b and drains 5a, 5b. The film of photosensitive resin at this time is formed to cover a region of the semiconductor layer 3 to be formed with a bulk layer 21.

The arsenic ion implantation for forming the high-concentration impurity layer constituting the sources 6a, 6b and the drains 5a, 5b is conducted at a dose of about $3\times10^{15}$ $cm^{-2}$.

Using photosensitive resin (not shown) as an ion implantation blocking film, boron (B), an impurity whose conductivity type is the same as that of the semiconductor layer 3, is introduced into the bulk region of the semiconductor layer 3 to form the bulk layer 21. The photosensitive resin at this time is formed to cover the sources 6a, 6b and the-drains 5a, 5b.

The boron ion implantation for forming the high-concentration impurity layer constituting the bulk layer 21 is conducted at a dose of about $3\times10^{15}$ $cm^{-2}$.

Figure 35:
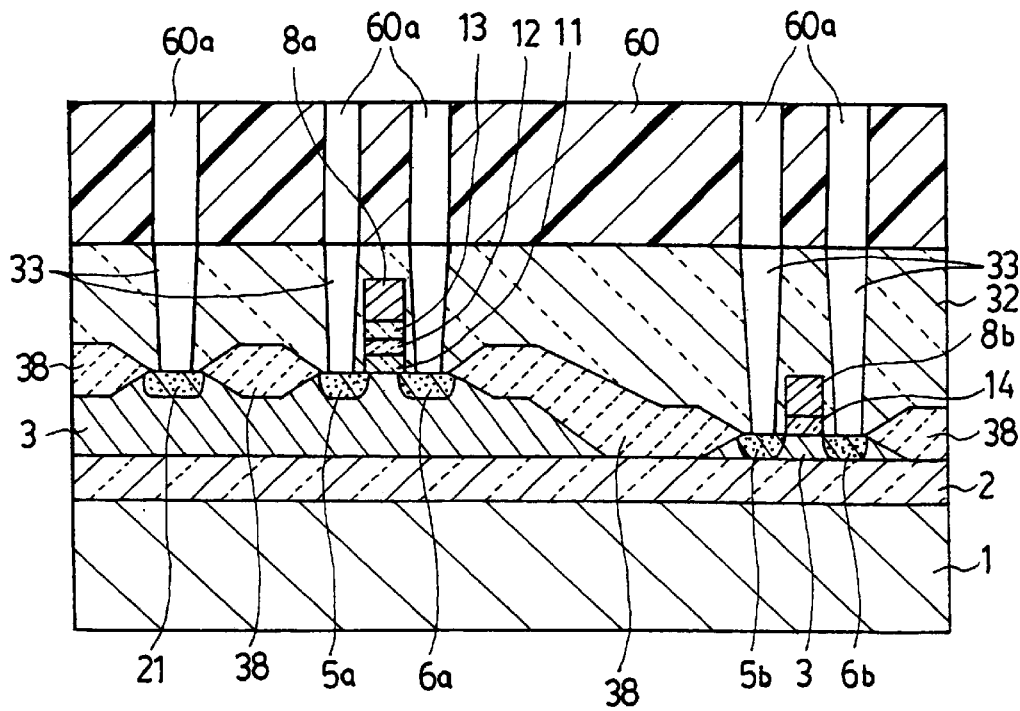

Next, as shown in FIG. 35, an interlevel insulator film 32 consisting of a silicon oxide film containing phosphorus and boron is formed over the whole surface to a thickness of about 400 nm by chemical vapor deposition.

The impurity ions implanted in the high-concentration impurity layers of the sources 6a, 6b, the drains 5a, 5b and the bulk layer 21 are activated by effecting annealing in a nitrogen atmosphere at 800° C. for 15 min.

Owing to this annealing, the high-concentration impurity layers of the drain 5b and the source 6b of the semiconductor component at the thinly formed region 42 contacts the insulating film 2, while the high-concentration impurity layers of the drain 5a and the source 6a of the semiconductor non-volatile memory cell at the thickly formed region 41 and the high-concentration impurity layer of the bulk contact 21 do not contact the insulating film 2.

The whole surface of the interlevel insulator film 32 is coated with photosensitive resin 60 by spin coating. The so-obtained photosensitive resin coating is then exposed through a prescribed photomask and developed to pattern a photosensitive resin film 60 having openings 60a corresponding to the contact holes.

The interlevel insulator film 32 is then etched using the patterned photosensitive resin film 60 as an etching mask to form contact holes 33.

The etching of the contact holes 33 is conducted with a reactive ion etching tool using a mixed gas of trifluoromethane ($CHF_3$) and difluoromethane ($CH_2F_2$) as the etching gas.

The photosensitive resin film 60 is then removed and a sputtering apparatus is used to form interconnecting material made of aluminum containing silicon and copper inside the contact holes 33 formed in the interlevel insulator film 32 and to a thickness of around 800 nm over the whole surface of the interlevel insulator film 32.

A film of photosensitive resin (not shown) formed is over the whole surface of the interconnecting material by spin coating is exposed through a prescribed photomask and developed to pattern the photosensitive resin film into a pattern corresponding to interconnecting electrodes.

Figure 36:
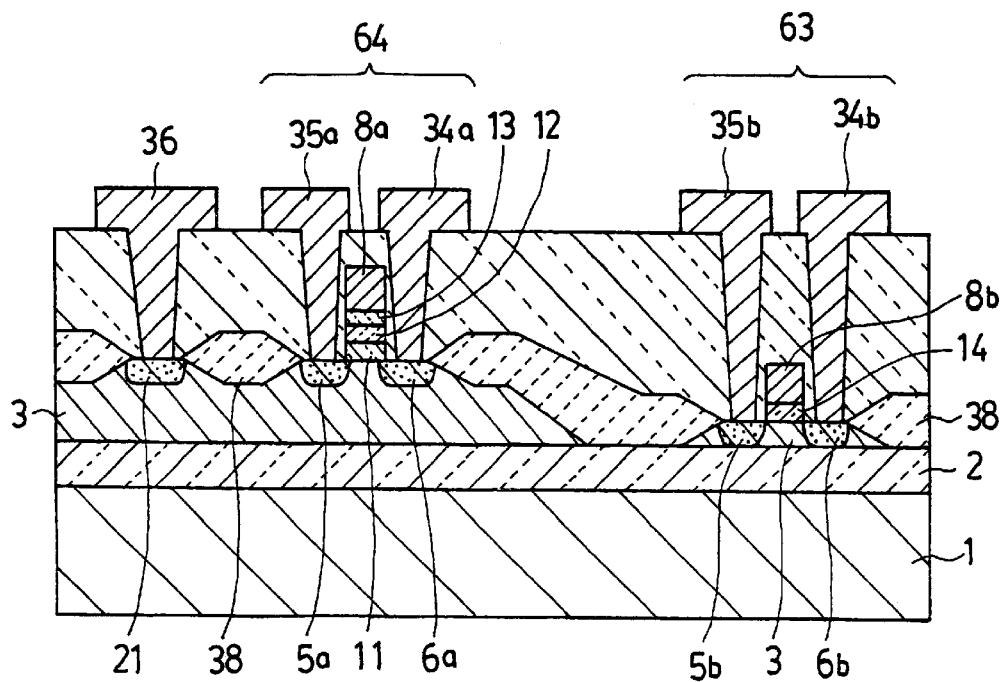

The interconnecting material is then etched using the patterned photosensitive resin film as an etching mask to form the interconnecting electrodes 34a, 34b, 35a, 35b, and 36 connected with the sources 6a, 6b, the drains 5a, 5b and the bulk layer 21 as shown in FIG. 36 and interconnecting electrodes (not shown) connected with the gates 8a, 8b.

The etching of the interconnecting material is conducted with a reactive ion etching tool using a mixed gas of chlorine ($Cl_2$) and boron trichloride ($BCl_3$) as the etching gas.

In this way, as shown in FIG. 7, a semiconductor non-volatile memory device can be fabricated with the memory cell 64 constituted by the MONOS semiconductor non-volatile memory cell formed in the thickly formed region 41 and the internal circuit 63 constituted by the MOS semiconductor component formed in the thinly formed region 42.

The foregoing embodiments were explained based on the use of a SIMOX substrate as the SOI substrate. However, the semiconductor device and the semiconductor non-volatile memory device of this invention can instead be fabricated using a DWB (Direct Wafer Bonding) substrate obtained by forming a silicon oxide film on the surface of one of two silicon substrates, bonding the silicon substrates together and reducing the thickness of one of the silicon substrates by polishing.

As an embodiment of the semiconductor nonvolatile memory cell according to the invention there was explained one of the MONOS type. The invention can, however, also be applied to a semiconductor device formed with an MNOS semiconductor non-volatile memory cell having a gate, a silicon nitride film and a tunnel oxide film formed on the channel region of a semiconductor layer and to a method of fabricating the same.

Although the formation of N-channel semiconductor components was explained by way of example, the invention can of course also be applied to the formation of P-channel semiconductor components.

Supplementary Explanation Regarding the Effect of the Invention

Figure 37:
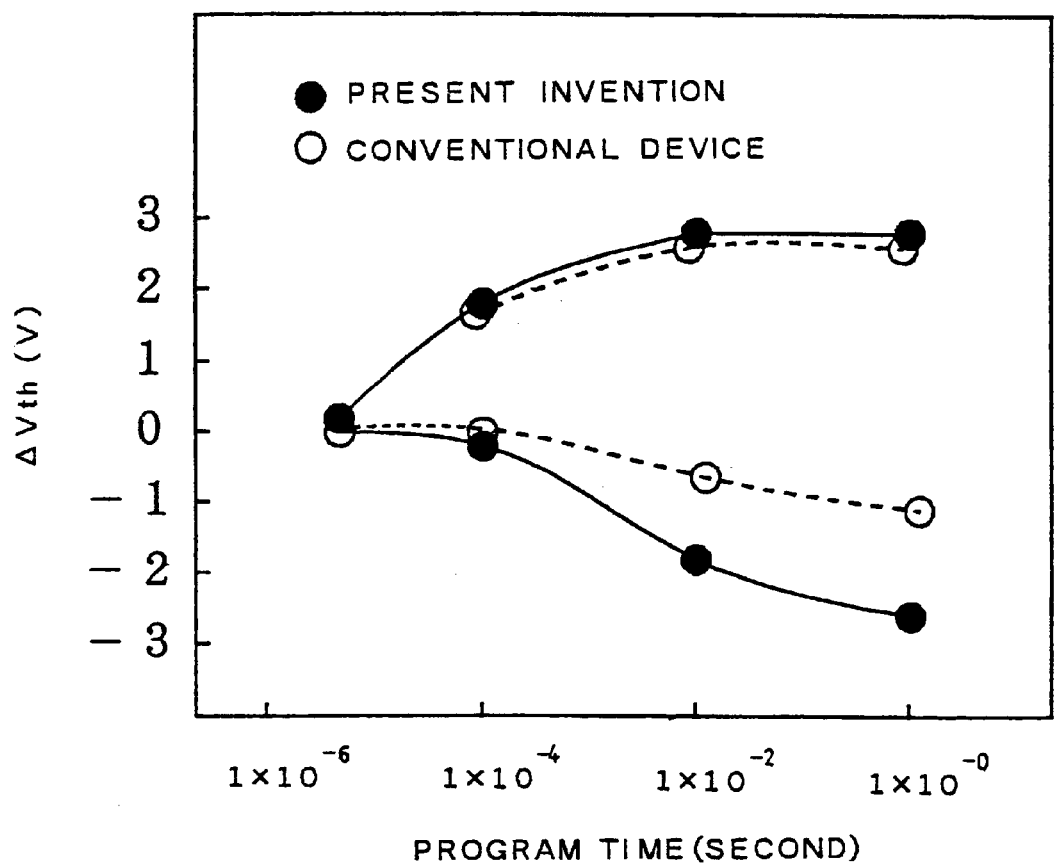
FIG. 37 is a graph for explaining the effect of an MONOS semiconductor non-volatile memory device fabricated using the fabrication method of the invention.
Figure 38:
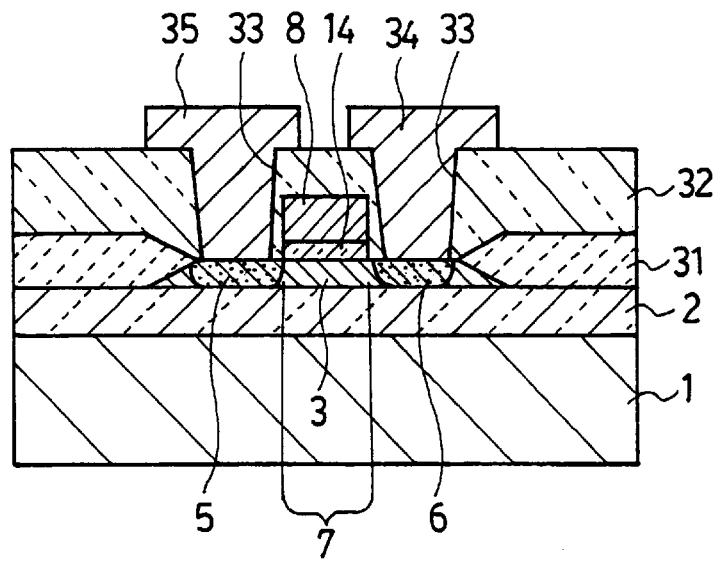
FIG. 38 is a schematic sectional view showing an example of the structure of a conventional semiconductor device formed with an MOS semiconductor component.
Figure 39:
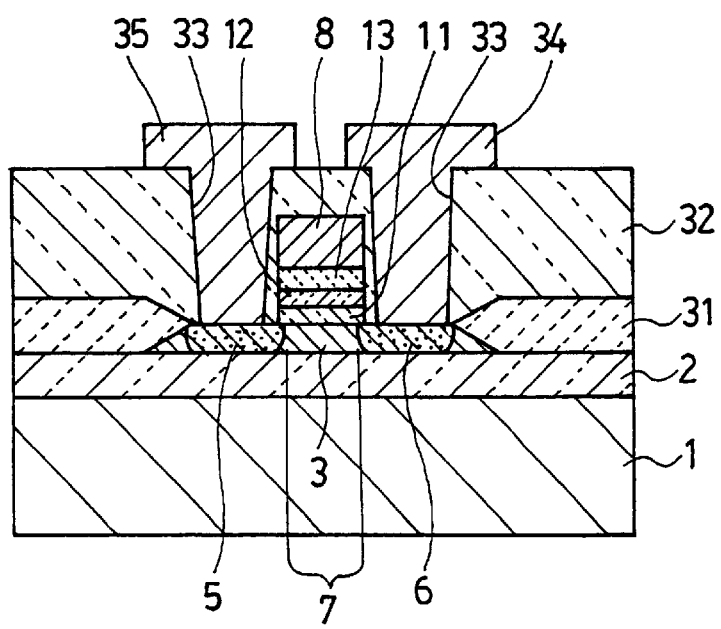
FIG. 39 is a schematic sectional view showing an example of the structure of a conventional semiconductor device formed with an MONOS non-volatile memory cell.

The effect of this invention will be explained with reference to the characteristic diagram of FIG. 37. FIG. 37 shows the N-channel transistor data rewrite characteristics of an MONOS semiconductor non-volatile memory device fabricated by the method of this invention and an MONOS semiconductor non-volatile memory cell fabricated by method of the prior art.

In the characteristic diagram of FIG. 37, the horizontal axis represents program time in logarithmic value and the vertical axis represents change in threshold voltage $\Delta Vth$ (V) when the program voltage was 9 V, and threshold voltage increase owing to electron injection is represented as positive and threshold voltage decrease owing to hole injection is represented as negative.

Threshold voltage increase owing to electron injection is defined as "write" and threshold voltage decrease owing to hole injection is defined as "erase." The data rewrite characteristic of the conventional device (open circles) exhibited slow and small threshold voltage change on the erase side. This means that the erase time during data rewrite was long and that the data write depth was insufficient.

With the conventional characteristics, the supply of electrons from the source and drain owing to the positive bias applied to the gate during write produces an inversion layer at the surface of the channel region and the resulting injection of electrons into the memory gate insulating film causes a write operation to the MONOS semiconductor non-volatile memory device.

During erase operation, however, the supply of holes from the semiconductor layer is insufficient owing to the absence of a bulk layer so that the erase is not sufficiently effected. Specifically, a thin semiconductor layer experiences depletion when bias voltage is not applied to the gate. In this state, the substantial erase field decreases even if a negative voltage is applied because the substantial layer thickness includes the depletion layer and the insulating film added to the gate oxide film. This, plus the absence of a bulk contact, causes the semiconductor layer potential to be unstable and makes the erase insufficient.

As shown by the solid circles in FIG. 37, the MONOS semiconductor non-volatile memory device provided with the bulk contact according to this invention exhibits an excellent rewrite characteristic superior to that of the prior art also on the erase side.

This effect is obtained owing to the provision of the bulk contact which stabilizes the semiconductor layer potential during erase operation and enables supply of holes from the semiconductor layer.

What is claimed is:

1. A method of fabricating a semiconductor device comprising:

a step of subjecting a semiconductor substrate including a supporting substrate, an insulating film on the supporting substrate and a semiconductor layer on the insulating film to isotropic etching of a portion of the semiconductor layer to reduce the thickness of said portion and provide the semiconductor layer with a thickly formed region, a thinly formed region and a boundary region of gradually changing thickness between said two regions, a step of forming a gate oxide film and a gate in order on a portion of the semiconductor layer which includes the thinly formed region and the region of gradually changing thickness and is destined to become a channel region, a step of forming a source and a drain by introducing impurity of opposite conductivity type from the semiconductor layer into portions of the semiconductor layer on opposite sides of the channel region at least one of which is a thickly formed region, a step of forming a bulk layer by introducing impurity of the same conductivity type as the semiconductor layer into the thickly formed region of the semiconductor layer, a step of forming an interlevel insulator film over the whole surface of the semiconductor layer formed with the gate, the source, the drain and the bulk layer, and a step of forming contact holes in the interlevel insulator film and forming interconnecting electrodes through the contact holes to connect with the gate, the source, the drain and the bulk layer.

2. A method of fabricating a semiconductor device according to claim 1, wherein the step of subjecting the semiconductor substrate to isotropic etching of a portion of the semiconductor layer causes a region of the semiconductor layer for forming the source to fall in the thinly formed region and a region thereof for forming the drain to fall in the thickly formed region.

3. A method of fabricating a semiconductor device according to claim 1, wherein the step of subjecting the semiconductor substrate to isotropic etching of a portion of the semiconductor layer causes a region of the semiconductor layer for forming the drain to fall in the thinly formed region and a region thereof for forming the source to fall in the thickly formed region.

4. A method of fabricating a semiconductor device according to claim 1, wherein the step of subjecting the semiconductor substrate to isotropic etching of a portion of the semiconductor layer causes a middle portion of the channel region of the semiconductor layer to fall in the thinly formed region, portions on opposite sides of said middle portion to change gradually in thickness, and regions of the semiconductor layer on opposite sides of the channel region for forming the drain and the source to fall in the thickly formed region.

5. A method of fabricating a semiconductor device comprising:

a step of subjecting a semiconductor substrate including a supporting substrate, an insulating film on the supporting substrate and a semiconductor layer on the insulating film to isotropic etching of a portion of the semiconductor layer to reduce the thickness of said portion and provide the semiconductor layer with a thickly formed region, a thinly formed region and a boundary region of gradually changing thickness between said two regions, a step of forming a gate insulating film including a tunnel oxide film, a silicon nitride film and a top oxide film on a portion of the semiconductor layer which includes the thinly formed region and the region of gradually changing thickness and is destined to become a channel region, a step of forming a gate on the gate insulating film, a step of forming a source and a drain by introducing impurity of opposite conductivity type from the semiconductor layer into portions of the semiconductor layer on opposite sides of the channel region at least one of which is a thickly formed region, a step of forming a bulk layer by introducing impurity of the same conductivity type as the semiconductor layer into the thickly formed region of the semiconductor layer, a step of forming an interlevel insulator film over the whole surface of the semiconductor layer formed with the gate, the source, the drain and the bulk layer, and a step of forming contact holes in the interlevel insulator film and forming interconnecting electrodes through the contact holes to connect with the gate, the source, the drain and the bulk layer.

6. A method of fabricating a semiconductor device according to claim 5, wherein the step of subjecting the semiconductor substrate to isotropic etching of a portion of the semiconductor layer causes a region of the semiconductor layer for forming the source to fall in the thinly formed region and a region thereof for forming the drain to fall in the thickly formed region.

7. A method of fabricating a semiconductor device according to claim 5, wherein the step of subjecting the semiconductor substrate to isotropic etching of a portion of the semiconductor layer causes a region of the semiconductor layer for forming the drain to fall in the thinly formed region and a region thereof for forming the source to fall in the thickly formed region.

8. A method of fabricating a semiconductor device according to claim 5, wherein the step of subjecting the semiconductor substrate to isotropic etching of a portion of the semiconductor layer causes a middle portion of the channel region of the semiconductor layer to fall in the thinly formed region, portions on opposite sides of said middle portion to change gradually in thickness, and regions of the semiconductor layer on opposite sides of the channel region for forming the drain and the source to fall in the thickly formed region.

9. A method of fabricating a semiconductor device comprising:

a step of forming a semiconductor substrate including a supporting substrate, an insulating film on the supporting substrate and a semiconductor layer on the insulating film to provide the semiconductor layer thereof with a thickly formed region and a thinly formed region, a step of forming a pad oxide film over the whole surface of the semiconductor layer and forming an oxidation-resistant film on the pad oxide film, a step of etching away the oxidation-resistant film at a component separation region, effecting selective oxidation using the remaining oxidation-resistant film as an oxidation preventing film to form a field oxide film at the component separation region, and removing the oxidation-resistant film and the pad oxide film, a step of forming a gate oxide film at the thinly formed region of the semiconductor layer, a step of forming a memory gate insulating film including a tunnel oxide film, a silicon nitride film and a top oxide film at the thickly formed region of the semiconductor layer, a step of forming gates on the gate oxide film and the memory gate insulating film, a step of forming a source and a drain by introducing impurity of opposite conductivity type from the semiconductor layer into regions of the thinly formed region of the semiconductor layer aligned on opposite sides of the gate, a step of forming a source and a drain by introducing impurity of opposite conductivity type from the semiconductor layer into regions of the thickly formed region of the semiconductor layer aligned on opposite sides of the gate, a step of forming a bulk layer by introducing impurity of the same conductivity type as the semiconductor layer into a region separated from the regions formed with the gates, the sources and the drains by the field oxide film of the thickly formed region of the semiconductor layer, a step of forming an interlevel insulator film over the whole surface of the semiconductor layer formed with the gates, the sources, the drains and the bulk layer, and a step of forming contact holes in the interlevel insulator film and forming interconnecting electrodes through the contact holes to connect with the gates, the sources, the drains and the bulk layer.

10. A method of fabricating a semiconductor device according to claim 9, wherein the step of forming the semiconductor substrate to provide the semiconductor layer thereof with a thickly formed region and a thinly formed region comprises:

a step of forming a pad oxide film and an oxidation-resistant film on the semiconductor layer, a step of etching away a portion of the oxidation-resistant film and effecting selective oxidation using the remaining oxidation-resistant film as an oxidation preventing film to form a field oxide film at the thinly formed region, and a step of removing the oxidation-resistant film, the pad oxide film, and the field oxide film.

* * * * *